US010976395B2

(12) United States Patent
Tomi-Tricot et al.

(10) Patent No.: US 10,976,395 B2
(45) Date of Patent: Apr. 13, 2021

(54) COMPUTER-IMPLEMENTED METHOD OF BUILDING A DATABASE OF PULSE SEQUENCES FOR MAGNETIC RESONANCE IMAGING, AND A METHOD OF PERFORMING MAGNETIC RESONANCE IMAGING USING SUCH A DATABASE

(71) Applicants: COMMISSARIAT A L'ENERGIE ATOMIQUE ET AUX ENERGIES ALTERNATIVES, Paris (FR); INSTITUT NATIONAL DE RECHERCHE EN INFORMATIQUE ET AUTOMATIQUE, Le Chesnay (FR)

(72) Inventors: Raphaël Tomi-Tricot, Briis-sous-Forges (FR); Bertrand Thirion, Bures sur Yvette (FR); Vincent Gras, Chevreuse (FR); Alexis Amadon, Villiers-St-Frederic (FR); Nicolas Boulant, Janvry (FR); Alexandre Vignaud, Paris (FR)

(73) Assignees: COMMISSARIAT A L'ENERGIE ATOMIQUE ET AUX ENERGIES ALTERNATIVES, Paris (FR); INSTITUTE NATIONAL DE RECHERCHE EN INFORMATIQUE ET AUTOMATIQUE, Le Chesnay (FR)

( * ) Notice: Subject to any disclaimer, the term of this patent is extended or adjusted under 35 U.S.C. 154(b) by 169 days.

(21) Appl. No.: 16/460,959

(22) Filed: Jul. 2, 2019

(65) Prior Publication Data
US 2020/0011953 A1    Jan. 9, 2020

(30) Foreign Application Priority Data
Jul. 9, 2018   (EP) .................................... 18305909

(51) Int. Cl.
*G01R 33/561*   (2006.01)
*G06F 16/906*   (2019.01)
(Continued)

(52) U.S. Cl.
CPC ..... *G01R 33/5613* (2013.01); *G01R 33/5612* (2013.01); *G06F 16/906* (2019.01);
(Continued)

(58) Field of Classification Search
CPC .. G06F 16/906; G06K 9/6219; G06K 9/6277; G01R 33/246; G01R 33/54;
(Continued)

(56) References Cited

U.S. PATENT DOCUMENTS

| 7,847,554 B2 | 12/2010 | Nistl et al. | |
| 2010/0090694 A1* | 4/2010 | Heid | G01R 33/54 324/309 |
| 2018/0252788 A1* | 9/2018 | Boulant | G01R 33/5612 |

FOREIGN PATENT DOCUMENTS

WO    2017/060142 A1    4/2017

OTHER PUBLICATIONS

Bernstein, et al., "Imaging artifacts at 3.0T", J Magn Reson Imaging, vol. 24, No. 4, pp. 735-746, 2006.
(Continued)

*Primary Examiner* — Steven L Yeninas
(74) *Attorney, Agent, or Firm* — BakerHostetler

(57) ABSTRACT

A computer-implemented method of building a database of pulse sequences for parallel-transmission magnetic resonance imaging, includes a) for each of a plurality of subjects, determining an optimal sequence for the subject; b) for each subject, computing the values of the or of a different cost or merit function obtained by playing the optimal sequences for all the subjects; c) aggregating the subjects into a plurality of clusters using a clustering algorithm taking the values, or (Continued)

functions thereof, as metrics; d) for each cluster, determining an averaged optimal sequence for the cluster; e) receiving, as input, a set of features characterizing an imaging subject, comprising at least a morphological feature of the subject; f) associating the subject to one pulse sequence of the database based on the set of features using the computer-implemented classifier algorithm; and g) performing magnetic resonance imaging using the pulse sequence. A magnetic resonance imaging apparatus for carrying out steps e)-g) of such a method is also provided.

19 Claims, 8 Drawing Sheets

(51) Int. Cl.
G06K 9/62 (2006.01)
G06N 7/00 (2006.01)
(52) U.S. Cl.
CPC ......... G06K 9/6219 (2013.01); G06K 9/6277 (2013.01); G06N 7/005 (2013.01)
(58) Field of Classification Search
CPC ............... G01R 33/543; G01R 33/546; G01R 33/5608; G01R 33/5612; G01R 33/5613; G01R 33/5659; G06N 7/005; G06T 2207/20081; G06T 2207/20084
See application file for complete search history.

(56) References Cited

OTHER PUBLICATIONS

Franklin, et al., "Improvement in B1-inhomogeneity artifacts in the abdomen at 3T MR imaging using a radiofrequency cushion", J Magn Reson Imaging, vol. 27, No. 6, pp. 1443-1447, 2008.
Katscher, et al., "Transmit SENSE", Magn Reson Med., vol. 49, No. 1, pp. 144-150, 2003.
Cloos, et al., "kT-points: Short three-dimensional tailored RF pulses for flip-angle homogenization over an extended volume", Magnetic Resonance in Medicine, vol. 67, pp. 72-80, 2012.
Beqiri, et al., "Whole-brain 3D FLAIR at 7T using direct signal control", Magn Reson Med, pp. 1533-1545, 2018.
Ianni, et al., "Machine learning RF shimming: Prediction by iteratively projected ridge regression", Magn Reson Med, 2018.
Mirfin, et al., "Optimisation of parallel transmission radiofrequency pulses using neural networks", Proc. Intl. Soc. Mag. Reson. Med, 2018.
Lee, et al., "Local SAR in Parallel Transmission Pulse Design", Magnetic Resonance in Medicine, vol. 67, pp. 1566-1578, 2011.
Fautz, et al., "B1 mapping of coil arrays for parallel transmission", Proceedings of the 16th Annual Meeting of ISMRM, p. 1247, 2008.
Hyos-Idrobo, et al., "On variant strategies to solve the Magnitude Least Squares optimization problem in parallel transmission RF pulse design and under strict SAR and power constraints", IEEE Transactions in Medical Imaging, vol. 33, pp. 739-748, 2014.
Müllner, "The fastcluster package: User's manual", 2017.
Pedregosa, et al., "Scikit-learn: Machine learning in Python", J Mach Learn Res, vol. 12, pp. 2825-2830, 2011.
Geurts, et al., "Extremely randomized trees", Mach Learn, vol. 63, No. 1, pp. 3-42, 2006.
Wu, et al., "Probability estimates for multi-class classification by pairwise coupling", J Mach Learn Res, vol. 5, pp. 975-1005, 2004.
Le, et al., "Development and evaluation of TWIST Dixon for dynamic contrast-enhanced (DCE) MRI with improved acquisition efficiency and fat suppression", J Magn Reson Imaging, vol. 36, No. 2, pp. 483-491, 2012.
Hajnal, et al., "Initial Experience with RF shimming at 3T using a whole body 8 channel RF system", Proc. Intl. Soc. Mag. Reson. Med. 16, p. 496, (2008).
Tomi-Tricot, et al., "B1 artifact reduction in abdominal DCE-MRI using kT-points: First clinical assessment of dynamic RF shimming at 3T", J Magn Reson Imaging, 47(6), pp. 1562-1571, Jun. 2018.
Gras, et al., "Design of universal parallel-transmit refocusing kT-point pulses and application to 3D T2-weighted imaging at 7T", Magn Reson Med., vol. 80, No. 1, pp. 53-65, Jul. 2018.
Cortes, et al., "Support-vector networks", Machine Learning, vol. 20, Issue 3, pp. 273-297, Sep. 1995.
Gras, et al., "Universal pulses: A new concept for calibration-free parallel transmission", Magnetic Resonance Medicine, vol. 77(2), pp. 635-643, Feb. 17, 2016.
Gras, et al., "Homogeneous non-selective and slice-selective parallel-transmit excitations at 7 Tesla with universal pulses: A validation study on two commercial RF coils", PLoS One, vol. 12, No. 8, p. e0183562, Aug. 21, 2017.

* cited by examiner

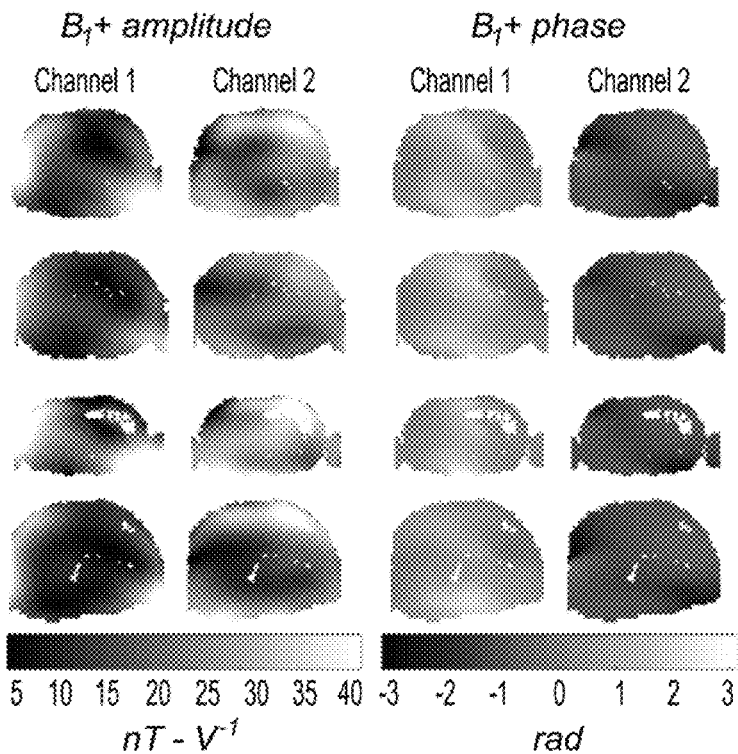
*Fig. 3A*  *Fig. 3B*
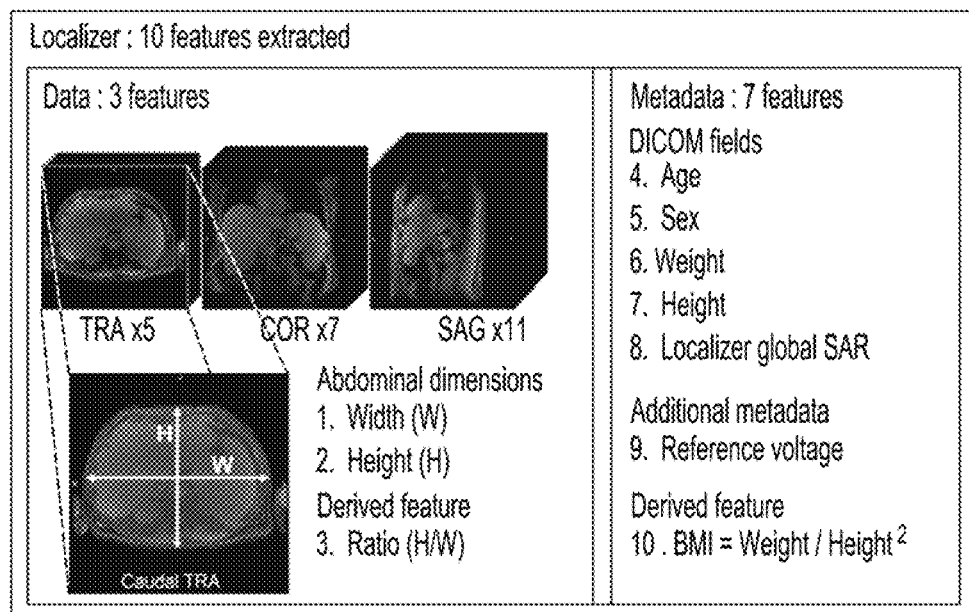
*Fig. 5*

COMPUTER-IMPLEMENTED METHOD OF BUILDING A DATABASE OF PULSE SEQUENCES FOR MAGNETIC RESONANCE IMAGING, AND A METHOD OF PERFORMING MAGNETIC RESONANCE IMAGING USING SUCH A DATABASE

CROSS-REFERENCE TO RELATED APPLICATIONS

This application claims priority to foreign European patent application No. EP 18305909.6, filed on Jul. 9, 2018, the disclosure of which is incorporated by reference in its entirety.

FIELD OF THE INVENTION

The invention relates to a method of designing a database of pulse sequences for parallel-transmission magnetic resonance imaging and of performing parallel-transmission magnetic resonance imaging using such a database. A pulse sequence comprises one or more radio-frequency (RF) pulses and at least one magnetic field gradient waveform, allowing manipulating the nuclear magnetization of a sample immersed in a static magnetic field, resulting from the orientation of nuclear spins. For the sake of simplicity, in what follows, sometimes a pulse sequence will be designated as a "pulse".

BACKGROUND

High field magnetic resonance imaging (MRI) has proved its utility in clinical routine thanks to the high signal-to-noise ratio (SNR) it provides, allowing finer temporal and/or spatial resolutions. However, a number of problems inherent to high field still hamper the spread of high-field (3T-7T) scanners in hospitals worldwide. Among them is the "B1 artifact" that occurs when the RF wavelength gets close to, or smaller than, the imaged region ([1]). In such a case, the transmitted radio-frequency "B1+" field becomes inhomogeneous within the region of interest, resulting in an inhomogeneous distribution of nuclear magnetization flip angles. This leads to the appearance of zones of shade and loss of contrast, which can affect diagnosis by hiding pathologies or by altering the observed enhancement ratio in contrast-agent-injected sequences. At 3T, this artifact is particularly pregnant in abdominal imaging, while for brain imaging it becomes relevant at ultra-high fields (UHF-7T and above).

Several tools have been proposed to solve this problem, including passive and active RF shimming.

Passive RF shimming involves the use of dielectric pads for compensating B1inhomogeneity ([2]). Its effectiveness is somehow limited.

Active RF shimming makes use of parallel transmission (pTx), i.e. of multiple RF coils for exciting nuclear spins. Two main sorts of active RF shimming techniques exist: static and dynamic.

In static active RF shimming, the plurality of radio-frequency RF coil elements all transmit the same RF pulse with different complex weights, optimized to homogenize the B1 field [3]. For abdomen imaging at 3T, this technique is satisfactory for most patients, but it fails to offer homogeneous-enough excitation in about 10 to 20% of the cases, which is not acceptable. For higher field values, static active RF shimming is usually not satisfactory.

Dynamic RF shimming [4] consists in using multiple RF coils to simultaneously transmit respective RF pulses having different temporal waveforms, usually defined by complex time-varying envelopes. This technique allows achieving better uniformity than static shimming, but its complexity has made it essentially a research tool.

Reference [5] demonstrates the superiority of $k_T$-points [6] dynamic RF shimming in clinical routine for nonselective excitation of the abdomen at 3T.

Optimizing weighting coefficients (static shimming) or RF waveforms (dynamic shimming) requires calibration consisting at least in the measurement of B1+ maps from each transmit channel; moreover, for optimal dynamic RF shimming, an off-resonance frequency $\Delta f0$ map (corresponding to a static field inhomogeneity $\Delta B0$ map if no chemical shift like fat tissue is present) is also required before computation of the RF pulse. These computations are time consuming. For instance, on a 3T scanner with two channels, the whole calibration process can last nearly two minutes: 30 seconds for B1+ mapping, 15 seconds for $\Delta f0$ mapping, and between 5 seconds (static RF shimming) and 60 seconds (kT-points) for pulse design itself. This is even worse when the number of channels increases.

[7] describes a simplified static RF-shimming approach whereby several sets of complex weights—optimal for different categories of patients—are pre-computed; during clinical activity, the best suited one of these sets of parameters is chosen for each given patient. Calibration is then avoided, at the cost of a reduced homogeneity of the magnetization flip angle distribution.

"Universal pulses", introduced in [8] and [9], allows calibration-free dynamic RF-shimming: instead of designing a pulse specific to each subject, a pulse robust to inter-subject variability is created once and for all using calibration data of a population of subjects. Universal pulses were successfully implemented in the brain at 7T, with a variety of sequences and weightings, and different underlying pulse designs: $k_T$-points [8], [9], [10], [11], fast-$k_z$ spokes [10], direct signal control [12].

Universality, however, compromises individual homogeneity. Even if they provide acceptable results for a majority of the subjects, they fail to provide homogeneous-enough excitation in a significant number of cases.

A compromise solution, suggested by [9], consists of computing different "semi-universal" pulses, tailored to different groups of imaging subjects. More precisely, according to [9], a set of subjects are grouped into a plurality of cohorts according to morphological features—e.g. the size of the head for brain imaging—and a "semi-universal" pulse sequence is designed for each cohort. The same morphological features are then used for choosing the best suited pulse sequence for additional subjects. A drawback of this approach is that the cohorts are formed on an empirical basis, with no guarantee of the relevance of the features used for sorting the imaging subjects.

Other approaches have also been proposed to avoid the time-consuming calibration required by optimal RF-shimming. Reference [13] describes a method to infer RF coefficients of a static slice-specific RF shimming pulse using geometrical features of the head and limited B1+ information with good accuracy; this method has been designed for brain imaging and it is not certain that it would be effective for dealing with body parts showing larger inter-subject shape and dimension variations than those of the head, such as the abdomen. Reference [14] describes a neural network solution to predict dynamic RF shimming pulses, but the produced pulses lack performance. Both methods target slice-specific pulses for brain examinations at 7T.

SUMMARY OF THE INVENTION

The invention aims at overcoming the drawbacks of the prior art discussed above. More precisely it aims at conciliating the simplicity and user-friendliness of universal pulses with the important inter-subject variability found, for instance, in the abdomen at 3T. The invention also aims at providing more robust MRI sequences (i.e. less sensitive to movements of the subject, or any other perturbation of the image acquisition process).

According to the invention, instead of designing one pulse for all subjects as in the pure "universal pulse" approach, a population of subjects is divided into clusters, and one pseudo-universal pulse sequence is designed for each cluster. Then a machine learning algorithm classifies new subjects to assign the best possible pulse to each one of them on the basis of at least a morphological feature. Contrarily to the "semi-universal" approach of [9], the clusters are not defined empirically on the basis of somehow arbitrary morphological features, but in a systematic way using a clustering algorithm. More particularly, an optimal RF pulse sequence is computed for each one of N subjects; the N resulting sequences are played on each one of the subject, yielding $N^2$ magnetization flip angle (FA) distributions. The differences between these distributions and a target one (usually, a uniform FA having a predetermined value) define a metrics on the subject space, which is used for performing the clustering. Unlike in [9], then, the clustering is guaranteed to be based on relevant criteria. Then, machine learning allows assigning new subjects to the cluster using readily available data, for instance morphological features that can be extracted from a localizer acquisition—a compulsory step, prefatory to all imaging protocols.

Being optimized for a set of subjects, rather than for a single subject, the pulses sequences obtained by the inventive method are much more robust than "optimally tailored" sequences.

An object of the present invention is therefore a computer-implemented method of building a database of pulse sequences for magnetic resonance imaging, each pulse sequence comprising at least a magnetic field gradient waveform and a set of radio-frequency pulses, each pulse of said set being defined by a plurality of design parameters and being associated to a respective transmission channel of a magnetic resonance imaging apparatus; the method comprising:

a) for each of a plurality of magnetic resonance imaging subjects, determining a pulse sequence, called optimal sequence for the subject, optimizing a cost or merit function representative of a difference between a spatial distribution of nuclear magnetization flip angles, obtained by simulating the pulse sequence on the subject, and a target distribution;

b) for each subject, computing the values of said or of a different cost or merit function obtained by simulating the optimal sequences for all the subjects;

c) aggregating the subjects into a plurality of clusters using a clustering algorithm taking said values, or functions thereof, as metrics; and d) for each cluster, determining a pulse sequence, called optimal sequence for the cluster, optimizing a cost or merit function representative of an averaged difference between the spatial distribution of nuclear magnetization flip angles of the subjects belonging to the cluster and the target distribution.

Another object of the invention is a method of performing magnetic resonance imaging of a subject, comprising:

providing a database of pulse sequences, each pulse sequence comprising at least a magnetic field gradient waveform and a set of radio-frequency pulses, each pulse of said set being defined by a plurality of design parameters and being associated to a respective transmission channel of a magnetic resonance imaging apparatus;

receiving, as input, a set of features characterizing the subject, comprising at least a morphological feature of the subject;

associating the subject to one pulse sequence of the database based on said set of features using a computer-implemented classifier algorithm; and performing magnetic resonance imaging using said pulse sequence.

Yet another object of the invention is a magnetic resonance imaging apparatus comprising:

at least one radio-frequency transmission channel;

a set of gradient coils;

a memory storing a database of pulse sequences, each pulse sequence comprising at least a magnetic field gradient waveform and a set of radio-frequency pulses, each pulse of said set being defined by a plurality of design parameters and being associated to a respective transmission channel of the magnetic resonance imaging apparatus; and a computer programmed for:

receiving, as input, a set of features characterizing a magnetic-resonance imaging subject, comprising at least a morphological feature of the subject;

associating the subject to one pulse sequence of the database based on said set of features using a classifier algorithm; and driving the radio-frequency transmission channel or channels and the gradient coils for performing magnetic resonance imaging using said pulse sequence.

Particular embodiments of the inventive methods and apparatus constitutes the subject-matter of the dependent claims.

BRIEF DESCRIPTION OF THE DRAWINGS

Additional features and advantages of the present invention will become apparent from the subsequent description, taken in conjunction with the accompanying drawings, wherein:

FIG. 3A and 3B are B1+ maps (3A: field amplitude; 3B: field phase) for four subjects, illustrating the inter-subject variability of transmit B1 field in the abdomen;

FIG. 5 illustrates a feature vector used for classifying subjects;

DETAILED DESCRIPTION

Figure 1:
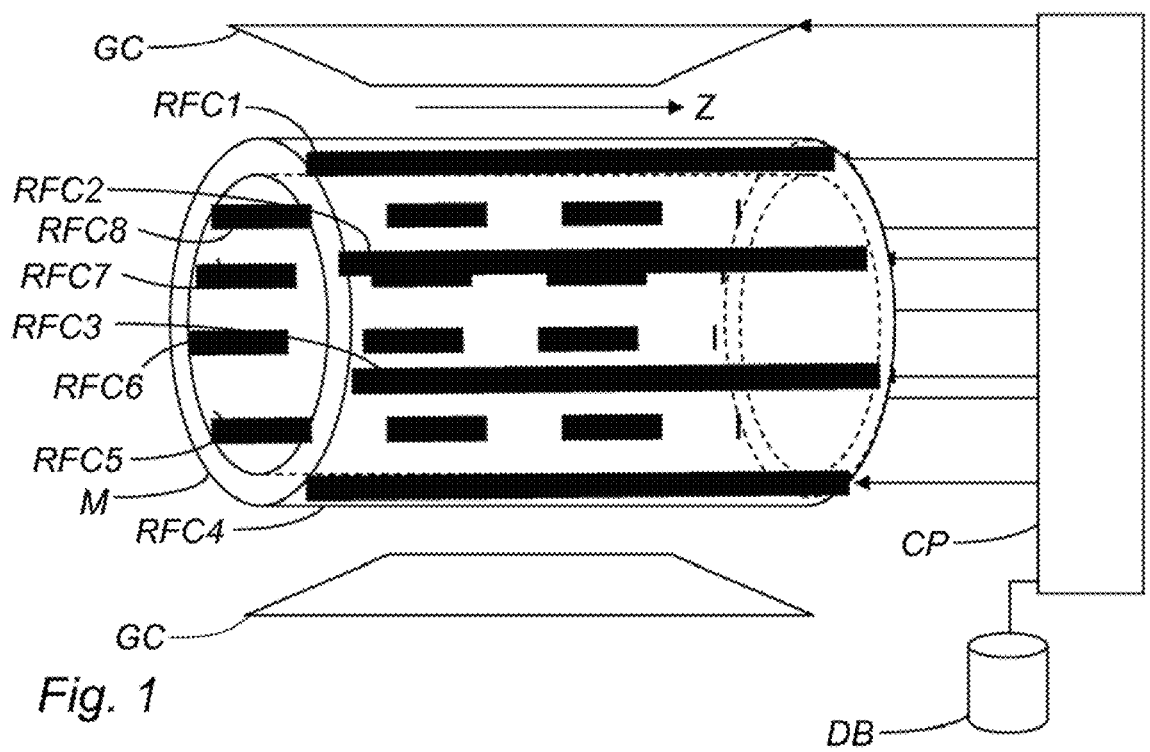
FIG. 1 is a schematic representation of a parallel-transmission magnetic resonance apparatus suitable for carrying out the invention.

FIG. 1 is a very simplified representation of a parallel-transmission MRI scanner, suitable for carrying out the invention. Reference M designates a magnet for generating a strong (e.g. 3T or even 7T) static magnetic field B0 oriented along a "longitudinal" direction z which, in the case of FIG. 1, is horizontal. The magnet is cylindrical and hollow, to allow the insertion of a subject (typically a human being) or of a body part thereof (e.g. the head). Additional magnets, called gradient coils (reference GC), are disposed outside the main magnet M and can be driven to generate slowly (i.e. not at radio-frequency) varying magnetic fields exhibiting intensity gradients along three orthogonal spatial dimensions. On the figure, only a pair of gradient coils is represented, allowing the generation of a gradient along a single spatial dimension. A plurality of radio-frequency coil elements are arranged at the periphery of the internal volume of the main coil M; in the example of FIG. 1 there are 8 of them: RFC1, RFC2, RFC3, RFC4, RFC5, RFC6, RFC7, RFC8. The coil elements are part of respective transmission channels, also including non-represented devices such as amplifiers, which are independently driven by a computer to emit respective RF pulses which, in general, have a same carrier frequency (at the Larmor frequency) and different, time-varying amplitudes and phases, which may be defined by a complex envelope. The signal processor also drives the gradient coils GC to generate gradient waveforms. The (non homogeneous) RF field B1+ is generated by the RF coil elements; the ensemble formed by the RF coil elements is sometimes called a (RF) coil.

According to the invention, the complex envelopes of a set of RF pulse sequences, comprising one RF pulse for each transmission channel of the scanner and advantageously also gradient waveforms, may be stored in a database to which the signal processor SP has access. Each pulse sequence is designed—using the method that will be described below—to fit a large number of subjects, rather than being tailored for a specific subject as in the prior art. Moreover, computer CP is programmed for receiving as input a vector of features describing a MRI subject and applying a classifier algorithm to it in order to associate the subject to one of the pulse sequences stored in the database.

Figure 2:
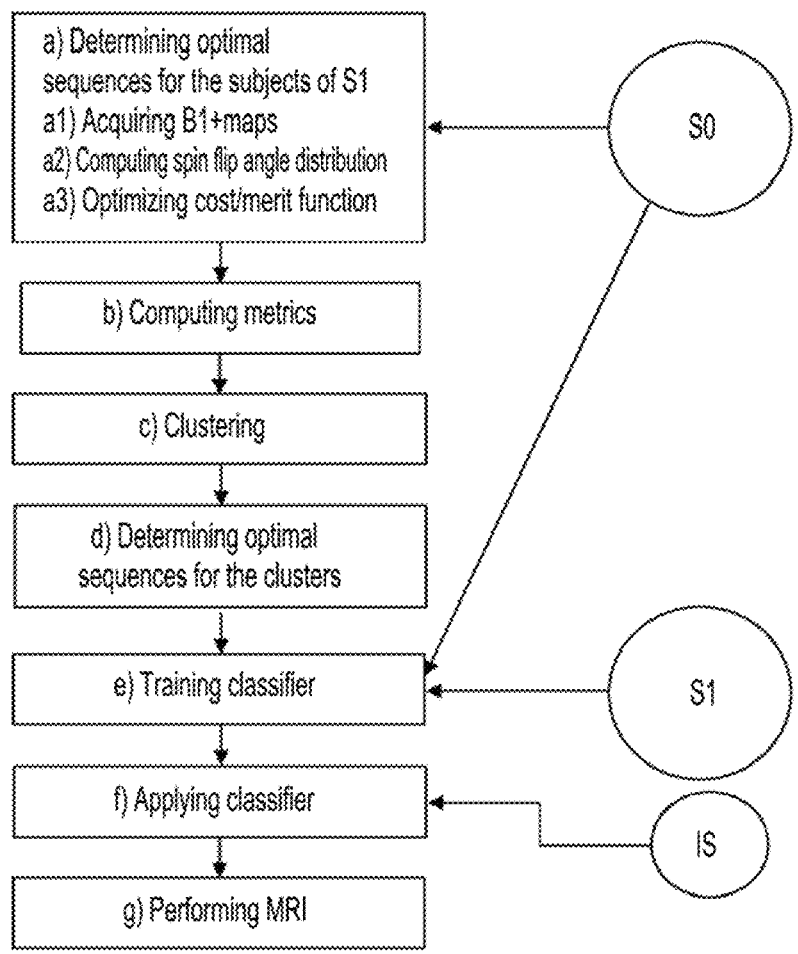
FIG. 2 is a flow-chart of a method according to the invention.

FIG. 2 illustrates the steps of a method of designing MRI RF pulses according to an embodiment of the invention.

Step a) consists in designing "optimal" pulse sequences for each one of a first set S0 of MRI subjects; for instance set S0 may comprise $N_{S0}$=50 individuals. A pulse sequence is considered optimal for a subject when it maximizes a merit function or minimizes a cost function which represents, respectively, the homogeneity or the inhomogeneity of the magnetization flip angle within a region of the subject's body obtained by playing the sequence on the subject. For instance, a cost function proportional or equal to the root-mean-square flip angle error integrated over all the volume of interest may be used. Alternatively, the cost function may include a term proportional to the standard deviation of the flip angle error. The optimization is usually performed under several constraints, typically including constraints on sequence duration, peak and average power, specific absorption rate (SAR) etc.

In the embodiment of FIG. 2, step a) comprises three main sub-steps.

Sub-step a1) consists in acquiring B1+—and preferably Δf0—maps are acquired for each subject (Δf0 maps include contributions from ΔB0 but also from chemical shifts). Several methods are known in the art for carrying out this step, see e.g. [15], [16]. It is important to note that, for each subject, several B1+ maps have to be acquired—one for each of the $N_c$ transmission channels of the scanner. Thus, if also Δf0 maps are acquired, sub-step a1) requires $N_{S,0}(N_c+1)$ independent measurements. This may require a significant time, but the measurements are performed "off-line", i.e. prior to the beginning of clinical examinations, and the members of the cohort may be healthy volunteers rather than patients.

Sub-step a2) of the method involves computing the nuclear magnetization flip angles (FA) for the $N_{S,0}$ members of set S0.

A RF pulse may be defined by a finite number of design parameters. These may be temporal samples of the complex envelope, Fourier coefficients of said envelope, coefficients of an analytical expression etc. Moreover, a magnetic field gradient waveform is played alongside the RF pulses. In an embodiment of the invention, the magnetic field waveform is predefined and fixed, and only the design parameters of the RF pulses are adjusted to optimize the excitation homogeneity. In an alternative embodiment, both the RF pulses and the gradient waveform (and therefore the k-space trajectory) are optimized; therefore, the gradient waveform is also expressed using adjustable design parameters. For carrying out sub-step a2) of the method for the first time, it is necessary to assign—e.g. randomly—initialization values to these design parameters.

Let us consider the case where nuclear spin excitation is performed non-selectively (i.e. over all the volume of interest) using the so-called "kT-points" technique [6] wherein gradient pulses define a broken line trajectory in k-space formed by (usually straight) segments linking discrete points (the "kT-points"), and wherein square RF sub-pulses are emitted in correspondence to said points (i.e. after each gradient pulse).

Let the volume of interest be decomposed into $N_v$ (e.g. $N_v$=12,000) voxels, each characterized by a respective value of the magnetization flip angle. Let $N_{kT}$ (e.g. $N_{kT}$=5) be the number of kT points, e.g. symmetrically located around the centre of the k-space; as each radio-frequency pulse is constituted by $N_{kT}$ square sub-pulses played at fixed times, its waveform can be defined by $N_{kT}$ complex amplitude values. Let $N_c$ (e.g. $N_c$=8) be the number of transmit channels, e.g. coil elements RFC1-RFC8 on FIG. 1.

In this case (see [17]), the flip angle can be expressed, in the small tip angle approximation, by:

$$FA = A \cdot x \quad (1)$$

where:
FA is a $N_v$-element column vector, whose elements represent the flip angle of respective voxels;
x is a p-element column vector, with $p=N_c \cdot N_{kT}$ obtained by concatenating the waveforms (each comprising $N_{kT}$ samples, see above) of the $N_c$ RF pulses forming a RF pulse set;
A is a $N_v \times p$ complex-coefficient matrix called the spin dynamics matrix, or Bloch operator, whose coefficients are given by:

$$a_{m,(j-1)N_c+n} = i B1_n(r_m)\exp(i\langle r_m,k_j\rangle)\exp(i\gamma\Delta B0(r_m)(T-(j-\tfrac{1}{2})T_s)) \quad (2)$$

where:
"i" is the imaginary unit;
$r_m$ is the position vector of the m-th voxel;
$B1_n(r_m)$, expressed in μT (microteslas), is the B1+ RF field generated, at maximum power, by the m-th channel at the m-th voxel; this is obtained during sub-step a1) of the method;
j is the index of the kT-point, and $k_j$ the corresponding point in the k space, obtained by computing the time-reversed integral of the magnetic field gradients played during excitation;

⟨.,.⟩ designates scalar product;
γ is the gyromagnetic ratio;
$\Delta B0(r_m)$, expressed in T (Teslas), is the inhomogeneity of the static magnetic field B0 at the m-th voxel; this is also obtained during sub-step a1) of the method;
T is the total pulse duration;
$T_s$ is the duration of each RF sub-pulse—e.g. 0.08 ms for a target flip angle of 9° or 0.5 ms for a target flip angle of 180°;
Normalization constant s is the flip angle obtained for a sub-pulse of duration $T_s$ and with a RF amplitude of 1 μT.

The generalization to other kinds of pulse sequences is straightforward. Alternatively, if the flip angle is too large, the small tip angle approximation breaks down and a full numerical integration of the Bloch equation is necessary.

At the end of sub-step a2), a flip-angle map—i.e. spatial distribution—is obtained for each subject of S0, allowing computing the above-mentioned merit or cost function.

In sub-step a3, the design parameters of the RF pulses, and preferably of the gradient waveforms, are iteratively adjusted for minimizing the cost function or maximizing the merit function, which involve re-computing the FA distribution. Therefore, $N_{S,0}$ pulse sequences are obtained, each one optimal for a subject of the S0 set.

Step b) consists in defining a metrics on set S0, i.e. in defining a "distance" between each pair of subjects of the set. In the embodiment of FIG. 2, this is performed by playing all the $N_{S,0}$ pulse sequences obtained at the end of step a) on all the $N_{S,0}$ subjects of set S0, and by computing the corresponding values of the cost or merit functions. The "distance" between subject "i" and subject "j" expresses the loss of homogeneity of the FA distribution obtained when the pulse sequence optimized for subject "j" is played on subject "i", compared to the situation where the pulse optimized for subject "i" is used.

In step c), the subjects are aggregated into a plurality of clusters using a clustering algorithm. Clustering is performed on the basis of the distances computed at step b). This means that the optimal sequence for any member of a cluster will produce a reasonably uniform FA distribution on any other member of the cluster. Preferably, but not necessarily, a hierarchical agglomerative clustering algorithm using a complete linkage scheme is used. The number of cluster may be predetermined or depend on the properties of the set of subjects. For instance, the number of clusters may be chosen such that the maximal distance (as defined above) between any two elements of any cluster is below a given threshold.

In step d), an optimal pulse sequence is computed for each cluster. This sequence minimizes (maximizes) an average cost (merit) function expressing the average homogeneity (inhomogeneity) of the FA distributions over the whole cluster. As in step a), optimization is preferably carried out under various constraints.

Step e) consists in training a classifier algorithm for associating MRI subjects to the clusters obtained at step c). The classification is performed based on a feature vector including at least one morphological feature. For instance, morphological features may be derived by "localizer images", i.e. by images obtained from a localizer sequence which is played before any MRI examination. Other features may also be used, such as identity data of the subject (age, sex . . . ), clinical data (height, weight, pathologies) and operating parameters of the magnetic resonance imaging apparatus (global SAR, reference voltage of the RF coils . . . ). Preferably, the feature vector does not include features derived by a B1+ of FA map, or more generally requiring a dedicated calibration step, given that one of the aims of the invention is precisely to avoid such calibration.

Any suitable machine learning algorithm may be used for carrying out step e). Preferably, the training is performed using the $N_{S,0}$ member of set S0 and $N_{S,1}$ additional subjects from a second set S1. Each subject of S1 is attributed to the clusters by testing all the "optimal" sequences determined at step d) on it and choosing the one which yields the most uniform FA distribution.

Step f) consists in using the trained classifier for associating a "new" subject IS—i.e. a subject belonging to neither S0 nor S1—to a cluster, proiding its feature vector as the input of the trained classifier algorithm.

Finally, in step g), magnetic resonance imaging of subject IS is carried out using the optimal sequence for the cluster to which the subject has been associated.

Hereafter, more details on the theoretical basis of the invention will be provided; then an exemplary embodiment of the inventive method will be described, and experimental results will be discussed.

Theory

Since the goal is to design short nonselective excitation pulses robust to B1-inhomogeneities, the $k_T$-points method was adopted, and its formalism used—see [6].

This section briefly recalls the design of subject-specific (tailored) as well as universal $k_T$-points pulse design ([8], [9]). Then, the theory specific to the invention is developed.

Tailored KT-Points Pulse Design

The most effective $k_T$-points pulse design consists in homogenizing the flip angle (FA) distribution in a region of interest by optimising simultaneously RF complex coefficients, k-space locations and durations of each $k_T$-point sub-pulse. With $N_{kT}$ sub-pulses on a pTx system equipped with $N_{Ch}$ transmission channels, and using the vectors x, k and t to represent, respectively, all sub-pulse RF complex coefficients, three-dimensional locations, and durations, the optimisation problem can be expressed as:

$$\underset{x,k,t}{\arg\min} \|A(x, k, t) - \alpha_T\|_2, (x, k, t) \in \mathbb{C}^{N_{Ch}N_{kT}} \times \mathbb{R}^{3N_{kT}} \times \mathbb{R}^{N_{kT}} \quad (3)$$

where $\alpha_T$ is the targeted FA and A is the Bloch operator that associates a FA to each voxel depending on its $B_1^*$ and $\Delta f_0$ values (see eq. 2). Optimisation is performed under peak power, average power and specific absorption rate (SAR) global and local constraints to comply with hardware limits and patient safety.

Universal KT-Points Pulse Design

As discussed above, the design of a universal pulse seeks to homogenise excitation not only in one subject but for the whole population, based on a sample of $N_s$ subjects. Here, in order to reduce the global FA inhomogeneity in the whole population while avoiding outliers, the mean plus standard deviation of the target-normalised root-mean-square FA errors (NRMSE) achieved in each subject was chosen as the cost function to be minimized. If $\mathcal{A} = \{A_1, \ldots, A_{N_s}\}$ represents the set of Bloch operators associated to each of the $N_s$ subjects in the population, then the pulse design consists in solving the following problem:

$$\underset{x,k,t}{\arg\min}(M(\varepsilon)), (x, k, t) \in \mathbb{C}^{N_{Ch}N_{kT}} \times \mathbb{R}^{3N_{kT}} \times \mathbb{R}^{N_{kT}} \quad (4)$$

where:

$\varepsilon = (\|A_i(x, k, t) - \alpha_T\|_2)_{1 \le i \le N_S}$ is the residual vector of root-mean-square FA errors applied over all voxels of interest for each subject, and:

$M(\varepsilon) = \langle \varepsilon \rangle + SD(\varepsilon)$. $\langle \cdot \rangle$ an $SD(\cdot)$ represent the sample mean and the sample standard deviation operators, respectively. This problem is also solved under all strict constraints as described in the previous case.

The Inventive Design Method

The inventive design method can be divided into two phases. First, $N_C$ clusters of subjects are formed from a database of $N_{S,0}$ subjects and one pseudo-universal pulse is designed for each cluster. Then, a classifier is trained on $N_{train}$ examples to assign the most appropriate pulse to a subject, given a set of simple features.

Clustering and Pulse Design

In order to perform database clustering, a tailored $k_T$-points pulse for each of the $N_{S,0}$ subjects was designed according to eq. (4), then the following matrix was formed:

$$\mathcal{N} = (v_{s,p})_{(s,p) \in [1 \ldots N_{S,0}]^2} \quad (5)$$

where $v_{s,p}$ denotes the NRMSE achieved by the $p^{th}$ pulse when applied to the $s^{th}$ subject.

The distance $\mathcal{D}$, between subjects was then computed by defining subject vectors $v_s = (v_{s,p})_{1 \le p \le N_{S,0}}$:

$$\mathcal{D} = (\|v_s - v_{s'}\|_2)_{(s,s') \in [1 \ldots N_{S,0}]^2} \quad (6)$$

Agglomerative hierarchical clustering on $\mathcal{D}$ with complete linkage, i.e. with the distance between two clusters of subjects I and J defined as $$d(I, J) = \max_{v_s \in I, v_{s'} \in J} \|v_s - v_{s'}\|_2 \quad (7)$$

was then performed

This is a bottom-up process that starts with each individual subject forming a singleton cluster. A new cluster K is created by joining the two clusters I and J of minimal pairwise distance d(I,J); I and J are then removed from the set. Clusters are iteratively joined two by two to form new larger clusters, until a single cluster containing all subjects is obtained. This process provides information on the distance between subjects and/or clusters of subjects that are closest to one another as they are successively joined. It emphasizes the inherent structure of the set of subjects, and allows discerning subjects that display similar behaviour to various RF pulses in terms of NRMSE. Then, given a number of desired clusters $N_C$, it is possible to find a distance threshold $d_{thresh}$ at which merging clusters is stopped, such that at most $N_C$ clusters are defined, inside which the distance between any two subjects is at most $d_{thresh}$. Alternatively, the distance threshold may be predetermined, which results in a non-predetermined number of clusters.

If the set of indices of subjects belonging to the $j^{th}$ cluster is designated by $\mathcal{C}_j$, clustered pulse design boils down to solving Eq. (4) for each subset $\mathcal{A}_j$:

$$\mathcal{A}_j = \{A_i | i \in \mathcal{C}_j\}, j \in [1 \ldots N_C] \quad (8)$$

to obtain $N_C$ pulses $p_j = (x_j, k_j, t_j)$.

Machine Learning

In the second phase of the process, a machine learning algorithm is trained on $N_{train}$ labelled subjects. For good classifier performance, a large number of training subjects is desirable. However, the clustering step described above is time consuming as it requires $(N_{S,0})^2$ pulse simulations. Therefore, as explained above, in order to expand the training set, $N_{S,1}$ additional subjects are acquired ($N_{train} = N_{S,0} + N_{S,1}$).

The $N_{S,0}$ subjects used for clustering are labelled from 1 to $N_C$ according to the cluster they belong to. Since the performance criterion used eventually is the NRMSE obtained by applying a pulse to a subject, each of the $N_{S,1}$ new subjects is labelled according to the cluster pulse $p_j$ that yields the lowest NRMSE. If $y_i$ denotes the class assigned to the $i^{th}$ subject:

$$y_i = \begin{cases} j \in [1 \ldots N_C] \text{ s.t. } i \in C_j & \text{if } i \in [1 \ldots N_{S,0}] \\ \arg\min_{j \in [1 \ldots N_C]} \|A_i(x_j, k_j, t_j) - \alpha_T\|_2 & \text{if } i \in [N_{S,0}+1, \ldots N_{S,0}+N_{S,1}] \end{cases} \quad (9)$$

This is a simple and fast way to expand the training database, making the proposed method easily scalable.

Detailed Description of an Exemplary Embodiment

Subjects and Scanner

B1+ maps for $N_{S,0} = 50$ consecutive subjects was used the clustering set S0. $N_{S,1} = 30$ additional subjects were used for training the classifier and $N_{test} = 53$ more were used for testing, thus totalling 133 patients (69 men, 64 women, age: 22-89 years, height: 1.45-1.91 m, weight: 45-140 kg, BMI: 17.6-43.7 kg·m$^{-2}$). The study was approved by the institutional review board at Centre Hospitalier Universitaire Henri Mondor.

Acquisitions were carried out on a MAGNETOM Skyra (Siemens Healthcare GmbH, Erlangen, Germany) 3T scanner, equipped with a two-channel pTx system used in clinical routine.

B1+ and Off-Resonance Mapping $B_1^+$ maps were measured through a manufacturer automatic adjustment procedure, a free-breathing magnetization-prepared turbo FLASH sequence performed in about 30 seconds. They were the same maps as the ones used for patient-specific static RF shimming.

$\Delta f_0$ maps were used for pulse design and FA simulations, but also to discriminate between water and fat voxels. Indeed, the pulses were intended for a fat-suppressed sequence, so only water voxels were considered for FA homogenization, leading to increased pulse performance in water as well as lower computation times. Assuming both tissues do not mix, this was achieved with a two-echo FLASH acquisition acquired in one breath-hold (10 s) with $\Delta TE = 0.95$ ms, short enough to avoid phase wrapping over a ±500 Hz frequency range.

Pulse design was performed from a 3D mesh of 5-mm isotropic voxels, so both $B_1^+$ and $\Delta f_0$ maps were downsampled to match that resolution.

Tailored and Universal KT-Points Pulse Design

9-$k_T$-point tailored pulses were designed for each subject, under SAR and hardware constraints, as done in [18]: with the goal of using them for DCE-MRI, a FA of $\alpha_T = 11°$ was targeted, for a TR of 6 ms, and a 1800-μs pulse duration limit was set. For local SAR prediction, virtual observation points (VOP) provided by the scanner were used.

A universal pulse was also designed on Subjects 1 through 50, according to Eq. 4. The pulse used throughout this study, $p_{UKT}$, had five sub-pulses and was 770-microsecond-long.

All pulse designs were performed using the active-set constrained optimization algorithm from MATLAB R2016a (The Mathworks, Natick, Mass.) on a laptop computer (Intel Core i7-4712HQ CPU, NVIDIA Quadro K1100m GPU).

FIGS. 3A-3B shows the inter-subject variability of transmit B1+ field in the abdomen for four subjects (top to bottom). Field of view and windowing are identical for all subjects.

Clustering and Pulse Design

Clustering and pulse design was based on Subjects 1 through $N_{S,0}=50$.

Figure 4A:
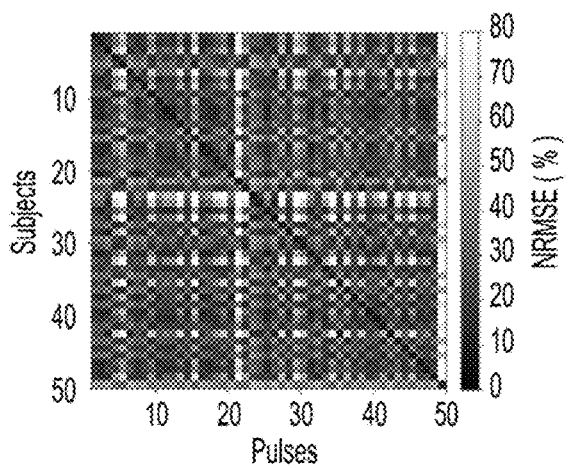
FIGS. 4A-4E illustrate the constitution of clusters.
Figure 4B:
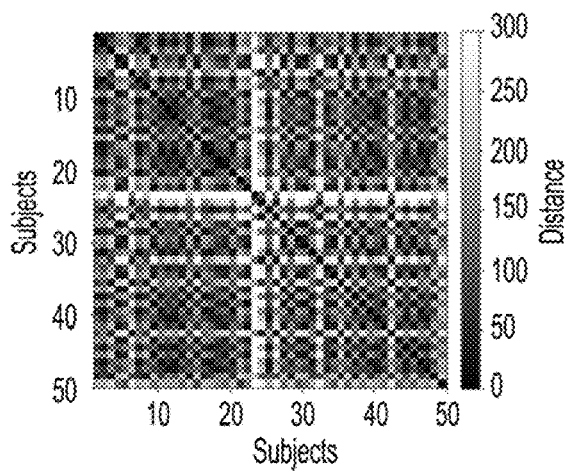
Figure 4C:
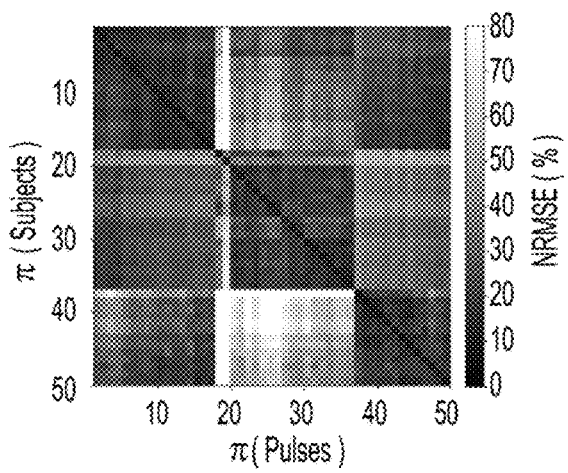
Figure 4D:
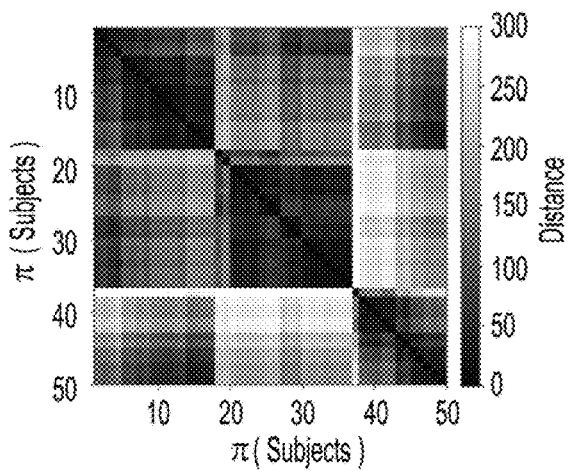

FIGS. 4a and 4b are representations of the $\mathcal{N}$ (NRMSE) and $\mathcal{D}$ (pairwise distances) matrices (equation 5 and 6), obtained using tailored $k_T$-points described above. FIGS. 4c and 4d show the same matrices, reorganized using permutation $\pi$ defined by the agglomerative hierarchical clustering applied on $\mathcal{D}$. Cluster structure becomes clearly visible in the form of three diagonal blocs with small inter-subject distances.

Figure 4E:
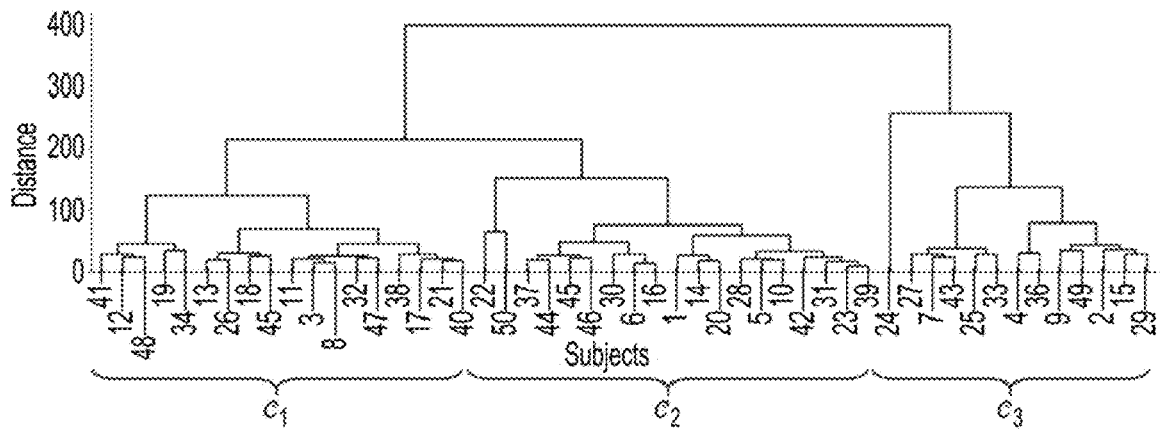

FIG. 4e is a dendogram illustrating the clustering process.

Agglomerative hierarchical clustering was performed using Python v2.7 (Python Software Foundation, https://www.python.org) and the fastcluster package [19]. Given the relatively small number of training data, a limited number of clusters was desirable: $N_c=3$ was chosen. Subject 24 behaved as an outlier and formed its own cluster, so it was manually attached to cluster $\mathcal{C}_3$ Pulses $p_{SP,1}$, $p_{SP,2}$ and $p_{SP,3}$ were created for cluster $\mathcal{C}_1$, $\mathcal{C}_2$ and $\mathcal{C}_3$ respectively, with the same 5-$k_T$-point design parameter as for $p_{UKT}$. Their optimized durations were 700 μs, 720 μs and 690 82 s, respectively.

Subject Classification: Features and Algorithm

As illustrated on FIG. 5, ten features were used for classification, all of them extracted from data from the localizer, which is a compulsory sequence placed at the very beginning of the protocol and used to set up the field of view (FOV) of subsequent acquisitions. The localizer sequence used locally for liver imaging consists in 5 axial (TRA), 7 coronal (COR) and 11 quasi-sagittal (SAG) T1-weighted 7.0-mm thick slices of 0.8-mm in-plane resolution, all acquired in one breath-hold (TA=17 s). Table 1 gathers the features corresponding to the subjects shown in the figures of this study, as well as a population summary.

body mass index (BMI) was derived from height and weight. Additional manufacturer-specific metadata was available, among which the reference voltage, calibrated by the scanner for each subject, and defined as the voltage necessary for a 500-μs hard pulse to create 90° excitation in a 1 cm-thick transversal slice at magnet isocenter. This value is related to the average $B_1^+$ in this slice in the default transmit configuration. The subject's abdominal width W and height H (2 features) were estimated by fitting an ellipse inscribed in the most caudal axial slice, and retrieving its major and minor axes (respectively). The most inferior slice was picked to ensure the ellipse fitting was performed in the abdomen, not in the thorax. In this pilot study, however, for some patients, the localizer was really off-centred; in those cases, the ellipse fitting was performed on the central slice of the magnitude images associated with the $\Delta f_0$ map. One last feature was derived from these measurements: the abdominal ratio H/W (height over width).

The classification algorithm was implemented using Scikit-learn [20]. In addition to the $N_{S,0}=50$ subjects used for clustering and pulse design, calibration data from $N_{S,1}=30$ subjects was acquired to form a training set of $N_{train}=80$ subjects. Two algorithms were separately tuned by repeated stratified cross-validation on this set, with 50 shuffles and 5 splits. An extremely randomized trees algorithm [21] with 4000 trees reached 84.3% cross-validation accuracy. A support vector machine multiclass classifier [22], [23] with a radial basis function kernel, $\gamma=0.18$ kernel coefficient, and C=1.5 error penalty achieved 84.9% accuracy. The algorithm selected for this study was a voter classifier averaging the output class probabilities of both algorithms; its cross-validation accuracy was 85.4%. Prediction score on the whole training set was 100%.

Excitation Homogeneity Assessment

A testing set was formed with Subjects 81 through 133 ($N_{test}=53$). For each subject, six techniques were compared:
  $p_{TF}$: TrueForm, the scanner default elliptically polarised pulse;
  $p_{TSS}$: manufacturers patient-tailored static RF shimming with coefficients automatically calculated by the scan-

TABLE 1

Features extracted from the five subjects focused on in the study

| Subject number | Age years | Sex | Height m | Weight kg | BMI kg·m$^{-2}$ | Abdomen AP[a] mm | Abdomen LR[a] mm | Abdomen ratio[a] % | $V_{ref}$[b] V | Localizer SAR$_g$[c] W·kg$^{-1}$ |
|---|---|---|---|---|---|---|---|---|---|---|
| 110 | 62 | M | 1.76 | 119 | 38.4 | 338 | 408 | 83 | 494 | 0.064 |
| 113 | 40 | F | 1.65 | 65 | 23.9 | 198 | 285 | 69 | 430 | 0.075 |
| 115 | 58 | M | 1.80 | 85 | 26.2 | 232 | 333 | 70 | 633 | 0.099 |
| 127 | 65 | M | 1.70 | 79 | 27.3 | 237 | 353 | 67 | 571 | 0.087 |
| 132 | 48 | M | 1.80 | 90 | 27.8 | 282 | 363 | 78 | 460 | 0.070 |
| All $N_{test}$[d] | 53 (16) | M: 26 F: 27 | 1.68 (0.09) | 78 (22) | 27.4 (6.3) | 242 (36) | 332 (38) | 73 (4.8) | 509 (75) | 0.078 (0.016) |

[a]Abdomen dimensions measured in the anterior-posterior (AP) and left-right (LR) directions, and ratio: AP/LR.
[b]Reference voltage measured by the scanner: voltage required for a 500-μs hard pulse to perform 90° excitation.
[c] Global specific absorption rate due to the localizer acquisition, as measured by the scanner.
[d]For all columns except sex: Mean (SD) over the testing set ($N_{test}$ = 53). For sex: number of male (M) and female (F) subjects.

Subject's age, sex, weight and height, given by the patients during registration, are compulsory data for any MRI examination on this scanner, and are available as DICOM fields, as specified in PS3.6: Data Dictionary. The global SAR measured by the machine during the localizer acquisition was also retrieved from DICOM fields. Subject's ner based on the subject's $B_1^+$ maps, but with a maximum voltage constrained to be less than or equal to that of TrueForm;
  $p_{OTSS}$: optimal static RF shimming, computed offline;
  $p_{TKT}$: patient-tailored $k_T$-points dynamic RF shimming, computed offline;

$P_{UKT}$: universal $k_T$-points;

$p_{SP}$: $k_T$-points pulses according to the invention, henceforth "SmartPulse".

Duration of hard pulses $P_{TF}$, $p_{TSS}$ and $p_{OTSS}$ was set to 100 µs. $p_{UKT}$ and $p_{SP}$ were applied to every subject without voltage scaling.

FA maps obtained with each technique were simulated by numerical Bloch integration based on actual $B_1^+$ and $\Delta f_0$ maps measured in subjects. FA average, coefficient of variation (CV) and NRMSE over water voxels in the volume of interest were estimated.

In the SmartPulse case, all three cluster pulses were tested, in order to determine whether the predicted $p_{SP}$ was actually the best option, and to assess the performance of an "ideal" process with no prediction errors.

Matched-pair Wilcoxon signed-rank tests were computed using the SciPy [24] stats package whenever FA NRMSE, CV or means of different techniques were compared. Reported p-values are two-sided significance levels; null hypothesis of equality of distribution medians was rejected for p less than 0.05.

In-Vivo Acquisitions 23 subjects from the test set were scanned in the presence of an expert pulse designer (R.T. -T.) while undergoing DCE-MRI. Additional sequences were run to compare images obtained with $p_{TF}$, $p_{TSS}$, $p_{TKT}$ and the predicted $p_{SP}$. To avoid disturbing the diagnostic DCE-MRI protocol, those sequences were only inserted prior to contrast agent injection and in late phase.

The sequence used was a $T_1$-weighted 3D FLASH, with "quick fat-saturation" [25] to remove hypersignal due to the short $T_1$ of fat that could mask contrast-agent-related enhancement. Fat saturation was achieved with a fat-selective 90°-pulse of gaussian shape, identical in all sequences. Sequence parameters were: FA=11°, TR/TE=6/3 ms, 320×220×72 matrix, 1.2×1.2×3.5 mm³ resolution, GRAPPA factor 2 in the phase encoding direction (anterior-posterior), 80%/50% phase/slice resolution, partial Fourier factor of 6/8, 505 Hz/pixel bandwidth, for an acquisition time of less than 23 seconds. The matrix size and/or resolution was sometimes slightly adjusted to accommodate larger patients while ensuring an acquisition time compatible with a breath-hold. Up to 33% oversampling was used in the partition-encoding direction to avoid aliasing. Two 30-channel surface coils (anterior and posterior) were used for reception. Only the channels necessary to cover the FOV were selected; this was done automatically by the scanner, and allowed to keep oversampling to a minimum. The manufacturers "Prescan Normalize" procedure was applied to all series in order to correct images for reception profile. However, this technique assumes homogeneous body coil reception, which is not the case in the abdomen as the corresponding reception profile is also affected by the $B_1$ artefact; significant inhomogeneity may therefore remain.

Elastic registration was applied to all acquisitions using Siemens software. This allowed to compare different series more easily, and to calculate, for each technique, the contrast enhancement (CE) and the enhancement ratio (ER) defined as:

$$CE = S_{late} - S_{ref} \tag{10}$$

and $$ER = \frac{CE}{S_{ref}} \times 100\% \tag{11}$$

where $S_{ref}$ and $S_{late}$ represent signal before and after injection, respectively. ER presents the advantage of completely removing the reception profile; however it will artificially increase with FA overshoot, contrarily to CE.

Results

Classification Performance

Figure 6A:
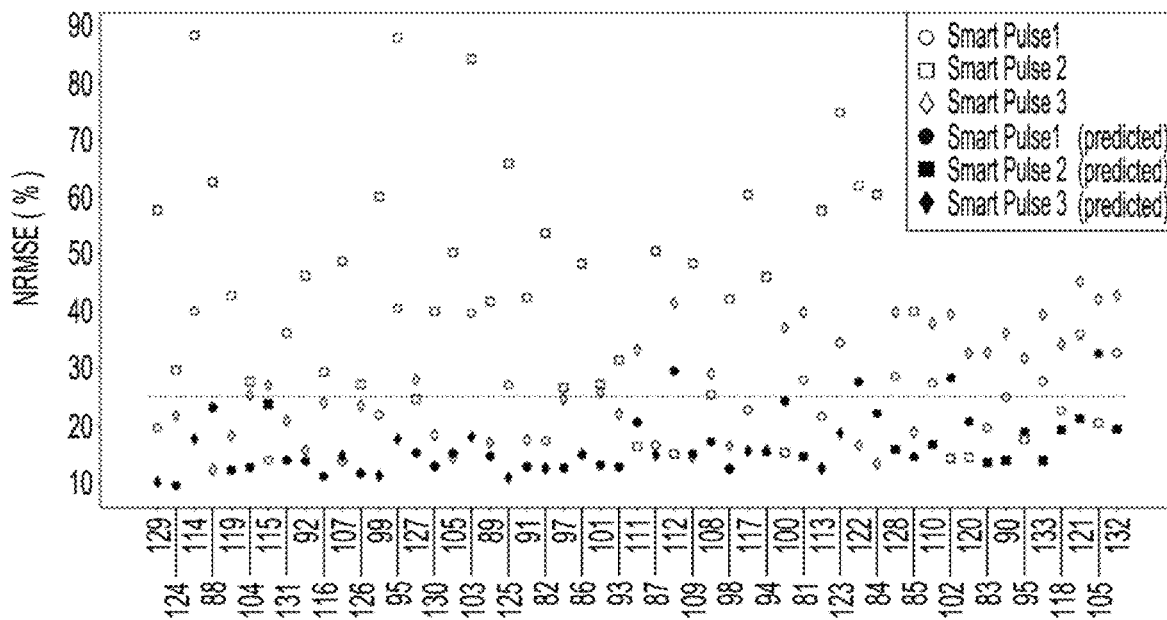
FIGS. 6A, 6B and 7A-7C are plots of simulation results, illustrating technical results of the invention.

Once the localizer sequence was acquired, the full process of feature extraction and SmartPulse prediction for one subject took one to two seconds. Strictly speaking, the accuracy of the algorithm on test data—i.e. the proportion of subjects that were assigned the pulse yielding minimal NRMSE—was 74%. However, in many cases two cluster pulses would perform similarly well, so the second best pulse, if chosen by the classifier, will yield an acceptable NRMSE in general. This is illustrated on FIG. 6a where the performance of each predicted SmartPulse (filled circles, squares, diamonds, for cluster pulses 1, 2 and 3, respectively) is compared to that of the two other cluster pulses (hollow circles, squares, diamonds for cluster pulses 1, 2 and 3, respectively). The dashed line indicates 25% NRMSE. Setting a 1.5% NRMSE tolerance in addition to the minimal NRMSE gives a classifying accuracy of 81%.

Comparison to Other Pulse Designs

Figure 6B:
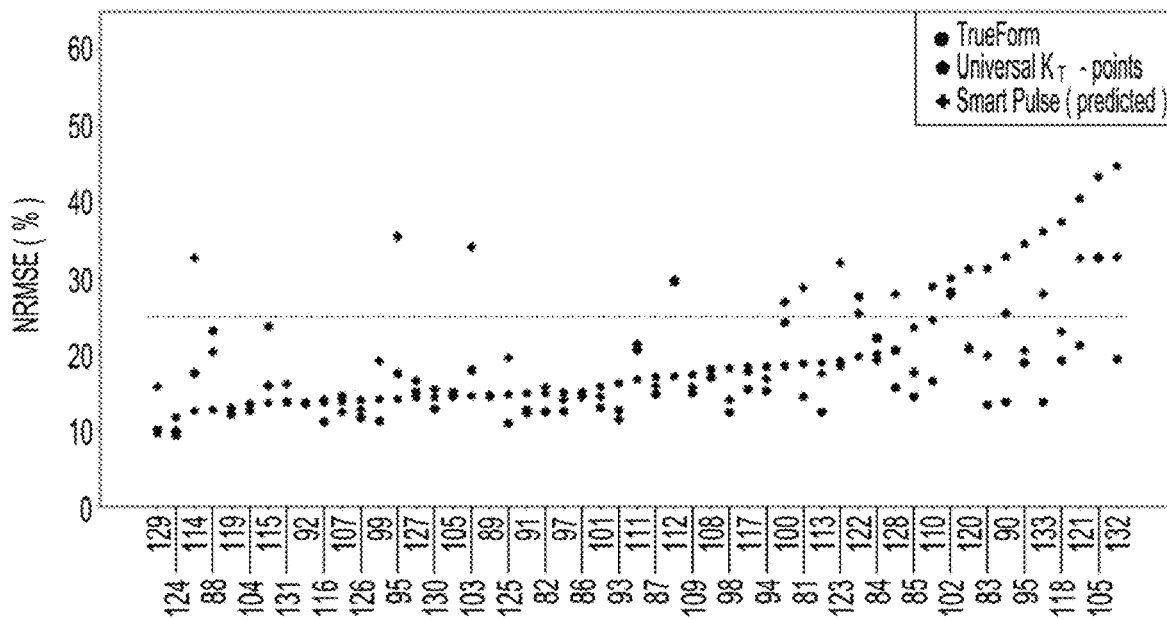

FIG. 6b compares SmartPulse (circles) to TrueForm (squares), the default calibration-free pulse. Universal pulse performance is also indicated (diamonds). To improve readability, only predicted psp are shown, not all options. The dashed line indicates 25% NRMSE. It can be noticed how subjects with a high TrueForm NRMSE are brought towards acceptable values.

Considering the same 1.5% margin, predicted $p_{SP}$ yielded lower NRMSE than $P_{TF}$ or was at least the best available $p_{SP}$ in 87% of the subjects. In three cases, even the optimal SmartPulse ($p_{SP,best}$) achieved lower performance compared to TrueForm: subject 96 (18% NRMSE for $p_{SP,best}$, 14% for $p_{TF}$), subject 103 (18% instead of 15%) and subject 114 (18% against 13%). $p_{SP}$ performed consistently better than $p_{TF}$, $p_{TSS}$ and $p_{UKT}$; they were comparable to $p_{OTSS}$ but the latter showed their limit for the most difficult subjects. All were outperformed by $p_{TKT}$.

In addition, $p_{SP}$ allowed 93% of subjects to get a NRMSE below 25% (dashed line on FIG. 7A), which is much more than $p_{UKT}$ (72% of subjects), $p_{TSS}$ (77%) and $P_{TF}$ (79%); comparable to $p_{OTSS}$ (96%), but less than $p_{TKT}$ (100%). However, with perfect classification, $p_{SP}$ would also have allowed 100% of subjects below that threshold.

Figures 7A, 7B, 7C:
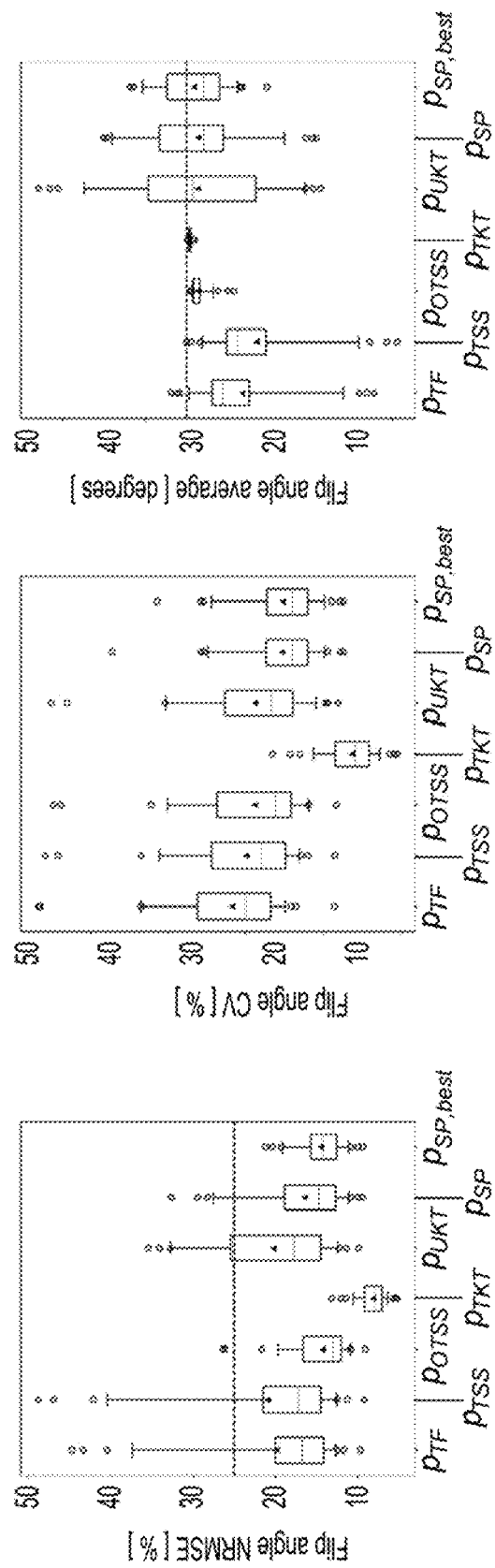

FIGS. 7A-7C shows the distribution of the different metrics used to assess pulse performance: pTF=TrueForm, pTSS=patient-tailored static RF shimming calculated by the scanner; pOTSS=optimal patient-tailored static RF shimming; pTKT=tailored kT-points; pUKT=universal kT-points; pSP=predicted SmartPulse, pSP,best=optimal SmartPulse. Green triangle=mean value; orange line=median; edges of the box=25th (Q1) and 75th (Q3) percentiles; whiskers=5th and 95th percentiles; circles=outliers. a. Flip angle (FA) NRMSE; the dashed line corresponds to the 25% threshold. b. FA coefficient of variation. c. FA average; the dashed line corresponds to the 11° target.

Sample average and SD of FA NRMSE, CV and mean are provided by Table 2, with more detail on their distribution in FIGS. 7A-7C.

Table 1. Detailed homogeneity assessment results of all tested pulses for the five subjects from Table 1:

TABLE 2

Detailed homogeneity assessment results of all tested pulses for the five subjects from Table 1

| Subject | $p_{TF}$ | $p_{TSS}$ | $p_{OTSS}$ | $p_{TKT}$ | $p_{UKT}$ | $p_{SP}$ | $p_{SP, best}$[a] |
|---|---|---|---|---|---|---|---|
| *Flip Angle NRMSE [%]* | | | | | | | |
| 110 | 29 | 32 | 15 | 8 | 25 | 17 | 17 |
| 113 | 19 | 20 | 14 | 8 | 18 | 12 | 12 |
| 115 | 14 | 13 | 13 | 7 | 16 | 23 | 14 |
| 127 | 14 | 14 | 12 | 7 | 17 | 15 | 15 |
| 132 | 45 | 49 | 26 | 9 | 33 | 19 | 19 |
| All $N_{test}$[b] | 20 (9) | 21 (10) | 14 (4) | 8 (2) | 20 (5) | 16 (5) | 14 (3) |
| *Flip Angle Coefficient of Variation [%]* | | | | | | | |
| 110 | 18 | 14 | 15 | 8 | 14 | 17 | 17 |
| 113 | 15 | 15 | 14 | 8 | 12 | 12 | 12 |
| 115 | 14 | 13 | 13 | 7 | 14 | 14 | 10 |
| 127 | 14 | 13 | 12 | 7 | 13 | 11 | 11 |
| 132 | 28 | 27 | 27 | 9 | 27 | 17 | 17 |
| All $N_{test}$[b] | 16 (4) | 15 (4) | 14 (4) | 8 (2) | 14 (4) | 13 (3) | 13 (2) |
| *Flip Angle Average [degrees]* | | | | | | | |
| 110 | 8.2 | 7.7 | 10.4 | 10.9 | 8.6 | 10.5 | 10.5 |
| 113 | 9.5 | 9.3 | 10.8 | 10.9 | 12.2 | 10.4 | 10.4 |
| 115 | 10.8 | 10.4 | 10.8 | 10.9 | 9.9 | 12.9 | 9.9 |
| 127 | 10.6 | 10.3 | 10.8 | 10.9 | 9.7 | 9.8 | 9.8 |
| 132 | 6.4 | 5.9 | 10.0 | 10.9 | 8.1 | 9.7 | 9.7 |
| All $N_{test}$[b] | 9.6 (1.3) | 9.3 (1.3) | 10.7 (0.2) | 10.9 (0.0) | 10.7 (1.8) | 10.7 (1.3) | 10.8 (0.8) |
| *Maximal SAR[c] [%]* | | | | | | | |
| 110 | 17 | 28 | 48 | 58 | 33 | 25 | 25 |
| 113 | 16 | 18 | 29 | 38 | 50 | 20 | 20 |
| 115 | 19 | 19 | 27 | 42 | 29 | 22 | 17 |
| 127 | 21 | 23 | 38 | 29 | 31 | 18 | 18 |
| 132 | 15 | 18 | 47 | 58 | 43 | 31 | 31 |
| All $N_{test}$[b] | 17 (4) | 18 (5) | 33 (12) | 38 (12) | 38 (12) | 21 (4) | 21 (5) | pTF = TrueForm;
pTSS = patient-tailored static RF shimming calculated by the scanner;
pOTSS = optimal patient-tailored static RF shimming;
pTKT = tailored kT-points;
pUKT = universal kT-points;
pSP = predicted SmartPulse;
pSP, best = optimal SmartPulse.
[a]pSP, best values are in bold in case of misprediction (when different from pSP).
[b]For each metric and each pulse: Mean (SD) over the testing set.
Ntest = 53.
[c]Maximum local SAR, estimated from the pulse shape, TR and virtual observation points provided by the scanner for each subject, expressed as a percentage of the maximal value authorized in quadrature mode.

Average $p_{SP}$ NRMSE was 16% (SD: 5%), lower than that of $p_{TF}$, $p_{TSS}$ and $p_{UKT}$, respectively 20% (SD: 9%, p=0.002), 21% (SD: 10%, p=0.0005) and 20% (SD: 5%, p<0.0001). Again, $p_{OTSS}$ were slightly more performing, with 14% (SD: 4%, p=0.001), but this difference would disappear (p=0.44, not significant), were the classification perfect. Other metrics allow deeper understanding of pulse performance: FA CV expresses sheer homogeneity, while FA average renders observance of the 11° target. With a mean CV of 13%, $p_{SP}$ outperformed all pulses but $p_{TKT}$. Although $p_{TSS}$ yielded better homogeneity than $p_{TF}$ (p<0.0001), it drifted further away from the FA target average: 9.6° (SD: 1.3°) and 9.3° (SD: 1.3°) respectively (p<0.0001). This was not the case for $p_{SP}$, which achieved better performance on FA average as well, with 10.7° (SD: 1.3°), and even 10.8° (SD: 0.8°) for $p_{SP,best}$ (p<0.0001 in both cases).

Finally, Table 2 and FIGS. 7A-7C also point out that while $p_{OTSS}$ and $p_{TKT}$ yield better NRMSE than $p_{TF}$ and $p_{TSS}$, SAR is much higher on average (p<0.0001 in all cases). This is not the case for $p_{SP}$: associated SAR is significantly higher (p=0.003) than that of $p_{TSS}$, but not by much. $p_{SP}$ SAR was 21% (SD: 4%) of the maximal authorized value vs 38% (SD: 12%) for both $p_{UKT}$ and $p_{TKT}$, and 18% (SD: 5%) for $p_{TSS}$.

One may be concerned about implications of mispredictions in terms of SAR, but SmartPulse seems to behave nicely: out of the 53 test subjects, the highest SAR encountered was 37% of the maximal allowed value, considering all three $p_{SP}$ options.

In-Vivo Acquisitions

FIGS. 8A-8B and 9A-9B show examples of images acquired before contrast agent injection and in late phase, as well as the CE and ER maps calculated according to Eq. [10] and [11].

Figure 8A:
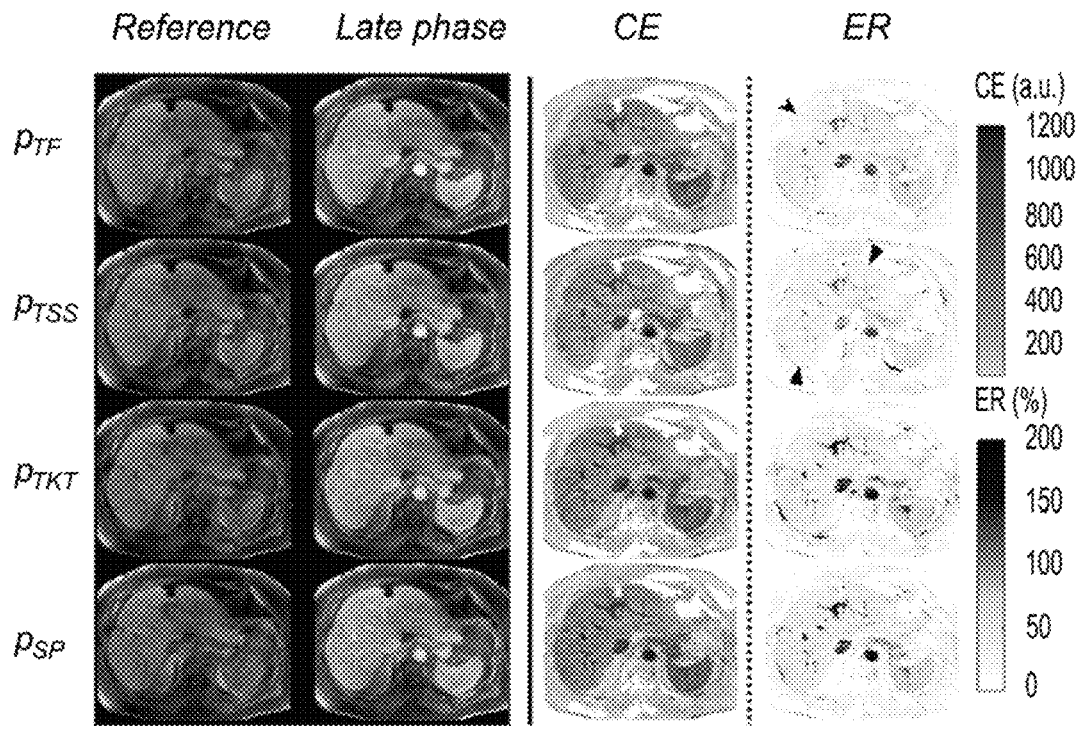
FIGS. 8A-8B and 9A-9B are in vivo experimental results, further illustrating technical results of the invention.
Figure 8B:
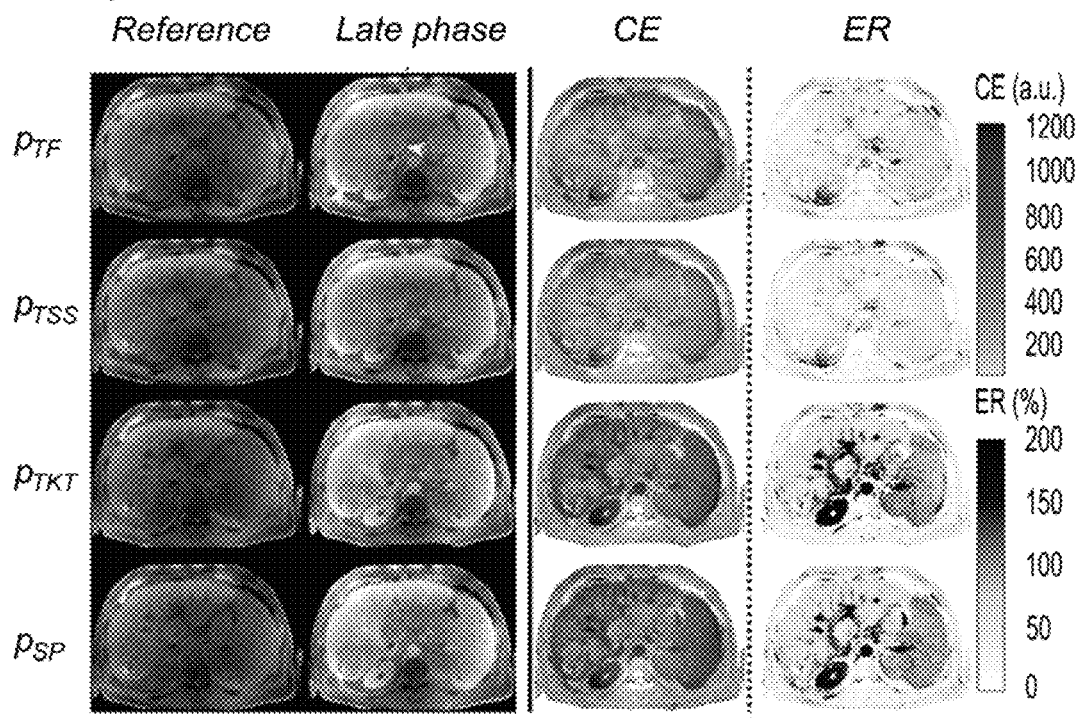

FIGS. 8A-8B focus on two "difficult" patients (Subjects 110 and 132) whose $p_{TF}$ NRMSE was above 25%—See Table 1 for patient characteristics and Table 2 for performance metrics. The figure shows, from left to right: pre-injection, post-injection, calculated contrast enhancement and enhancement ratio obtained with four pulse techniques.

On this figure: pTF: TrueForm; pTSS: patient-tailored static RF shimming; pTKT: patient-tailored kT-points; pSP: SmartPulse attributed to the subject.

For both subjects, the enhancement and ER maps lacked intensity and homogeneity for $p_{TF}$ and $p_{TSS}$. This artefact was largely alleviated with $p_{TKT}$ and $p_{SP}$.

For subject 110 (a), one may notice lack of ER in liver segment 5 with pTF (notched arrowhead) also visible on the CE image. pTSS results in a more homogeneous ER, but at the expense of global enhancement (full arrowheads). ER is improved with pTKT, and even more with pSP.

For Subject 132 (b), $T_1$ contrast was quite poor and substantial shading was visible on anatomical, EC and ER images with both $p_{TF}$ and $p_{TSS}$. Two hepatocellular carcinomas (arrowheads) are barely visible. T1 contrast is retrieved with both pTKT and pSP, and no shading remains in neither CE nor ER. Additional inhomogeneity can be noticed on anatomical and CE images, due to coil array receiving profile; only ER images are completely free of it. Almost no difference was visible between SmartPulse and tailored $k_T$-points images or enhancement maps, despite sensible disparity in FA NRMSE.

Figure 9A:
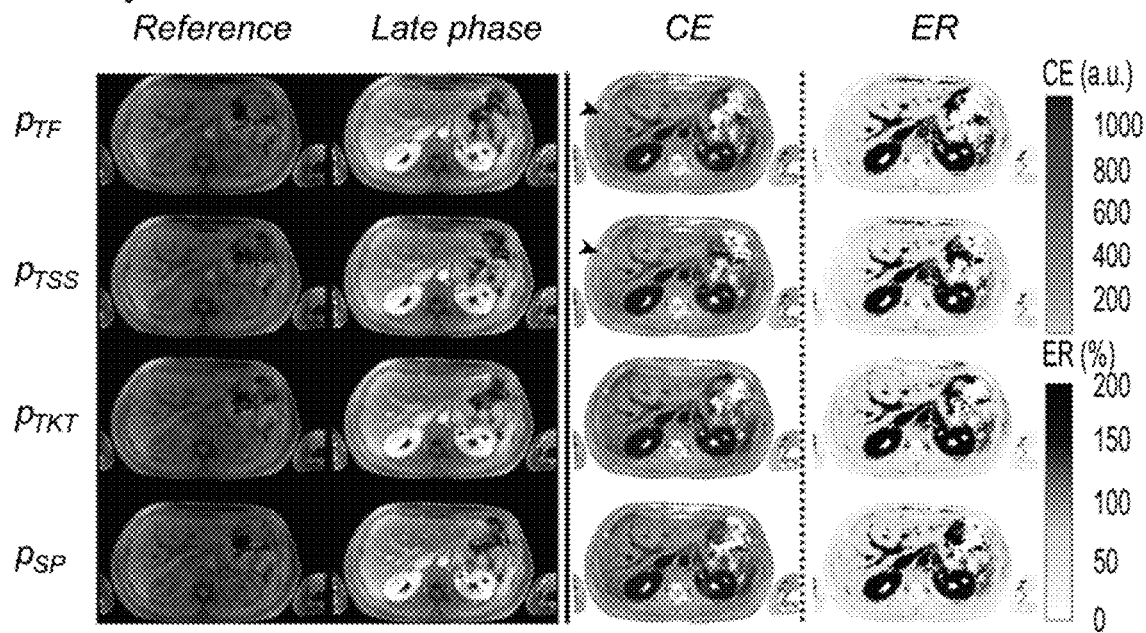
Figure 9B:
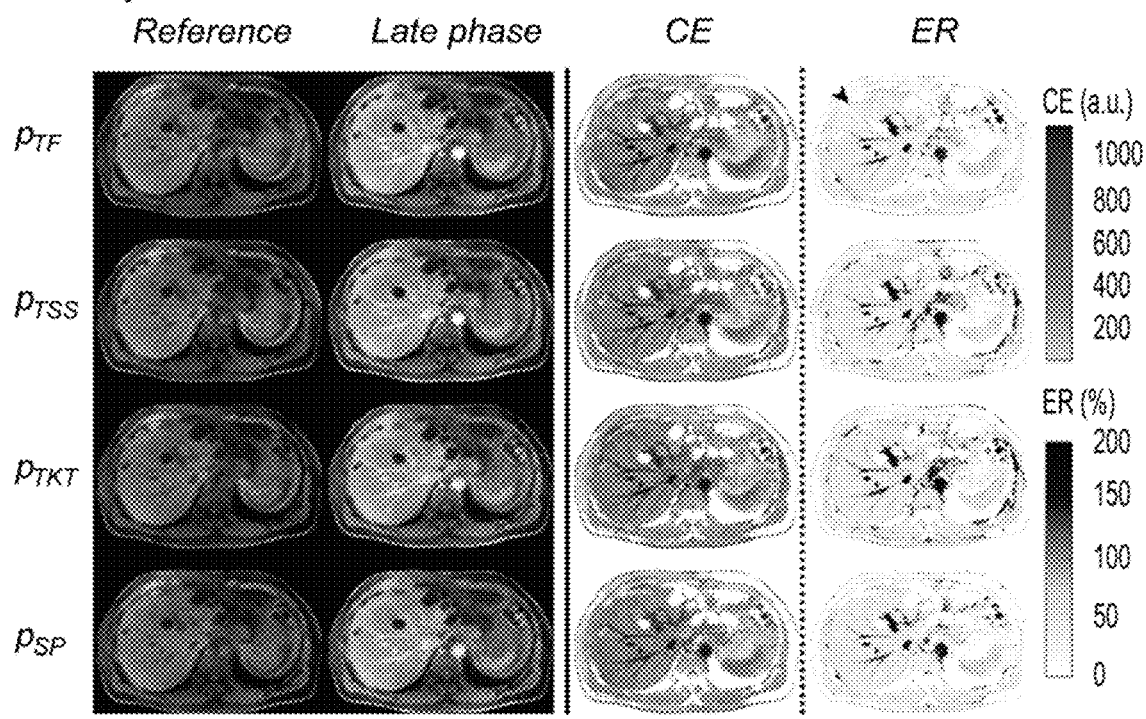

FIGS. 9A-9B allow comparing the different pulses on two "easier" cases: Subject 113 ($p_{TF}$ NRMSE of 19%) and Subject 127 ($p_{TF}$ NRMSE of 14%). Here, all techniques yielded similar results, all satisfying. Yet, some slight localized enhancement underestimations remained on $p_{TF}$ and $p_{TSS}$ acquisitions (arrowheads), but not with $p_{TKT}$ nor $p_{SP}$.

The figure shows, from left to right: pre-injection, post-injection, calculated contrast enhancement (CE) and enhancement ratio (ER) obtained with four pulse techniques applied to two "standard" subjects (TrueForm NRMSE below 25%). See Table 1 for patient characteristics and Table 2 for performance metrics. pTF: TrueForm; pTSS: patient-tailored static RF shimming; pTKT: patient-tailored kT-points; pSP: SmartPulse attributed to the subject. a. Arrowhead points out lack of CE in segment 8, also noticeable in ER maps, for both pTF and pTSS. This artefact is absent from pTKT and pSP maps, which look very much alike. b. All techniques perform similarly, except for a slight CE abnormality (arrowhead) with pTF.

Discussion

The inventive method provided correct pulse predictions in 87% of the cases. NRMSE simulation results were generally better with $p_{SP}$ than either with $p_{TF}$, $p_{TSS}$ and $p_{UKT}$, and comparable to those obtained with $p_{OTSS}$. This is even more true when considering perfect predictions ($p_{SP,best}$). SmartPulse was especially convincing in tempering inhomogeneity in the most difficult subjects. Moreover, these results are obtained almost instantly after completion of the introducing localizer sequence.

Comparing actual acquisition results brought out that SmartPulse does not produce images worse than tailored $k_T$-points pulse design, despite simulations favourable to the latter. Due to their "universal" nature, SmartPulse $k_T$-points may be more robust to patient motion during the acquisition or between calibration and DCE than their tailored counterpart, not forgetting that $B_1^+$ maps are acquired in free-breathing, thus generally do not correspond to breath-hold positions of subjects.

Better results can be obtained by further improving the two main aspects of this work: subject classification and pulse performance.

The difference between training and testing accuracy indicates model overfitting, which can be alleviated by enlarging the training base. However, this alone may not be enough.

Firstly, the way additional (non-clustering) subjects are labelled for training and testing—i.e. selecting the pulse yielding the best NRMSE—is different from the way clusters are made. High machine learning performance, for these subjects, expresses that the selected pulses are the best in terms of NRMSE. Of course, this is an interesting metric, as the aim is to obtain a low NRMSE eventually, but it is only loosely connected to the clustering scheme. Even though it is not really a problem, as such errors would occur between pulses with similar NRMSE on a given subject, it would still result in lower test scores. This is why a tolerance margin on NRMSE was used to further analyse classification performance.

Secondly, there were a few errors in the features used for extraction. Subject's height and weight were provided by the patients themselves, not measured on site, thus leading to slight approximations as people tend to give round values or to understate their weight, for instance. Most importantly, abdomen measurements could be much improved by automating localizer placement. This would ensure consistent localizer axial slice locations in the body, and would allow using more than one slice for abdominal dimensions estimation. Measurements at different locations in the abdomen would discard the assumption of a somewhat cylindrical body, while making the database more consistent. Another refinement would be to analyse other slice orientations, such as the coronal view—which is already acquired (see FIG. 5). For instance, Subject 106 suffered from massive splenomegaly, which probably explains its misclassification. Because of its mostly rostrocaudal extension, the abnormal spleen did not impact much abdominal dimensions in the axial plane; still it had an impact on excitation inhomogeneity.

Flawless class prediction would make NRMSE of all subjects in a 9%-21% range, which could induce perfectly acceptable examinations for every patient. Still, those results could be improved. In some cases (Subjects 96, 103, 114), $p_{Sp,best}$ NRMSE was slightly higher than that of $p_{TF}$. Also, because of an inadequate average FA, some subject show relatively high NRMSE despite having low CV.

This issue could be addressed by defining more (finer) clusters. This would require the acquisition of more subjects in order to train the classifier to discriminate between even more categories.

Figure 10:
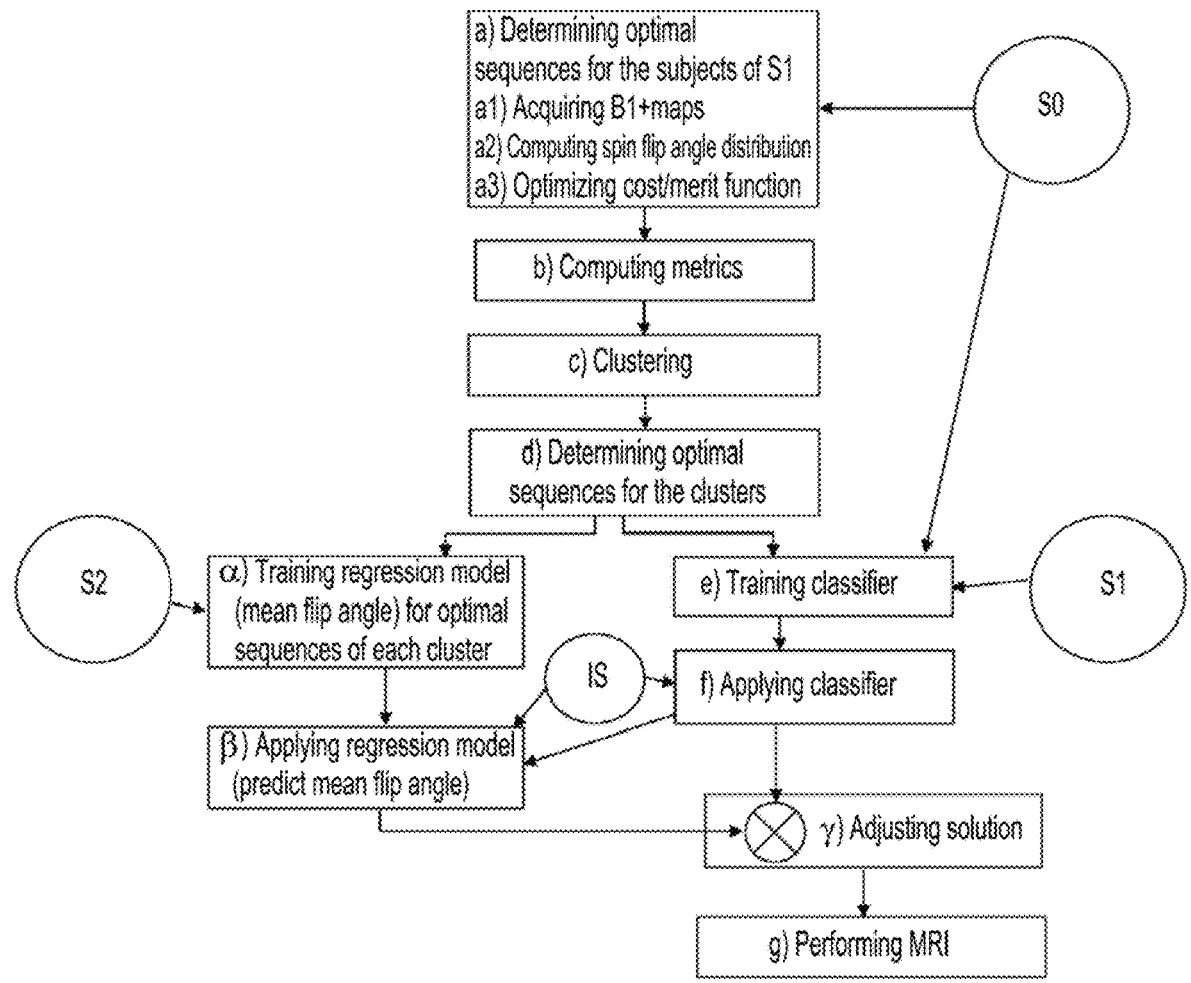
FIG. 10 is a flow-chart of a method according to a different embodiment of the invention.

In the embodiment illustrated on FIG. 10, three additional steps ($\alpha$, $\beta$ and $\gamma$) are carried out to ensure that the "smart pulses" lead to the desired value of the average flip angle. Indeed, the method described hitherto may yield pulses providing an acceptably uniform flip angle, but whose average value is slightly higher or lower than the target.

Step $\alpha$ consists in training a regression model predicting the average flip angle for a given "cluster pulse" as a function of the same features used by the classifier of steps e) and f), or a subset thereof. This training is carried out using a third set of subjects S2, on which all the sequences determined at step d) are simulated. Set S2 may coincide with S1.

Step $\beta$ consists in applying the regression model to subject IS, in order to predict the corresponding average flip angle for the "smart pulse" chosen by the classifier.

Step $\gamma$ consists in modifying the "smart pulse" chosen by the classifier at step f) in order to ensure that the actual average flip angle is as close as possible to a target value. Typically this is achieved by simply multiplying the RF amplitude by a scaling factor depending on the difference, or on the ratio, of the target FA value and the predicted one.

In conclusion, universal pulse design does not suffice to consistently homogenize excitation in 3T abdomen imaging for the whole population. The proposed method provides a simple and efficient trade-off between tailored and universal pulse design approaches. Although in general it did not provide better homogenization than the best possible tailored static RF shimming, it managed to perform equally well or better in most difficult subjects without sacrificing easier ones.

The approach is extremely fast as it gets rid of all calibration and optimization, which could prove useful especially for ultra-high field explorations of the body, where the increased number of transmit channels used to perform RF shimming makes calibration and pulse design even more tedious.

The inventive method leads to pulses which are not particularly demanding in terms of SAR. Energy deposition was not a limiting factor in this DCE study, but this property would be of interest in more SAR-inducing sequences.

Finally, the SmartPulse approach with underlying $k_T$-points pulses is readily implementable for nonselective preparation and 3D imaging to fight $B_1^+$ inhomogeneity in $T_1$-, $T_2^*$, $T_2$-, proton-density- or diffusion-weighted imaging. As universal selective pulses, it can also be used with other underlying pulse strategies like fast-$k_z$ spokes to achieve slab- or slice-selective behaviours and tackle full protocol optimisation.

Variants

The invention has been described with reference to some particular embodiments, but several alternative embodiments fall within the scope of the invention. For instance:

The target FA distribution is not necessarily uniform.

Clustering can be based on different metrics.

In the exemplary embodiment, the distance matrix has been computed using Euclidean distance, but other choices are possible, e.g. a cosine similarity.

The classifier can use different feature vectors, based or not on localizer images.

In the exemplary embodiment, only one localizer image, corresponding to a transversal cut, has been used for measuring the abdomen size. As mentioned above, taking into account localizer images with different orientation would allow a finer classification.

As mentioned above, the invention is not limited to the case of a $k_T$-point sequence; it can apply to any selective or non-selective excitation sequence, and to any imaging sequence, with any weighting (T1, T2, T2*, diffusion, proton density . . . ), and directed to any body part.

The invention also applies to the case where a single RF coil is used for excitation—a case to which static RF shimming does not apply.

REFERENCES

1. Bernstein M A, Huston J, Ward H A. Imaging artifacts at 3.0T. J Magn Reson Imaging. 2006; 24(4):735-746. doi:10.1002/jmri.20698

2. Franklin Kendra M., Dale Brian M., Merkle Elmar M. Improvement in B1-inhomogeneity artifacts in the abdomen at 3T MR imaging using a radiofrequency cushion. J Magn Reson Imaging. 2008; 27(6):1443-1447. doi:10.1002/jmri.21164

3. J. V. Hajnal, S. J. Malik, D. J. Larkman, D. O'Regan, K. Nehrke, U. Katscher, I. Graesslin, and P. Börnert, Initial Experience with RF shimming at 3T using a whole body 8 channel RF system, in Proceedings of the 16th Annual Meeting of ISMRM, Toronto, Ontario, Canada, 2008. p. 496.

4. Katscher U, Börnert P, Leussler C, van den Brink J S. Transmit SENSE. Magn Reson Med. 2003; 49(1):144-150. doi:10.1002/mrm.10353

5. Tomi-Tricot R, Gras V, Mauconduit F, et al. B1 artifact reduction in abdominal DCE-MRI using kT-points: First clinical assessment of dynamic RF shimming at 3T. J Magn Reson Imaging.:n/a-n/a. doi:10.1002/jmri.25908

6. Cloos M A, Boulant N, Luong M, et al. kT-points: Short three-dimensional tailored RF pulses for flip-angle homogenization over an extended volume. Magnetic Resonance in Medicine 67:72-80 (2012).

7. U.S. Pat. No. 7,847,554

8. Gras V, Vignaud A, Amadon A, Bihan D L, Boulant N. Universal pulses: A new concept for calibration-free parallel transmission. Magn Reson Med. 2017; 77(2):635-643. doi: 10.1002/mrm .26148

9. WO2017/060142

10. Gras V, Boland M, Vignaud A, et al. Homogeneous non-selective and slice-selective parallel-transmit excitations at 7 Tesla with universal pulses: A validation study on two commercial RF coils. PLOS ONE. 2017; 12(8): e0183562. doi:10.1371/journal.pone.0183562

11. Gras V, Mauconduit F, Vignaud A, et al. Design of universal parallel-transmit refocusing kT -point pulses and application to 3D T2 -weighted imaging at 7T. Magn Reson Med. 2018; 80(1):53-65. doi:10.1002/mrm.27001

12. Beqiri Arian, Hoogduin Hans, Sbrizzi Alessandro, Hajnal Joseph V., Malik Shaihan J. Whole-brain 3D FLAIR at 7T using direct signal control. Magn Reson Med. 2018; 0(0). doi:10.1002/mrm.27149

13. lanni Julianna D., Cao Zhipeng, Grissom William A. Machine learning RF shimming: Prediction by iteratively projected ridge regression. Magn Reson Med. 0(0). doi: 10.1002/mrm.27192

14. Mirfin C, Glover P, Bowtell R. Optimisation of parallel transmission radiofrequency pulses using neural networks. In: Proc. Intl. Soc. Mag. Reson. Med. Paris, France; 2018.

15 J. Lee et al. "Local SAR in Parallel Transmission Pulse Design" Magnetic Resonance in Medicine 2012; 67:1566-1578.

16 H-P. Fautz et al. "B1 mapping of coil arrays for parallel transmission" in Proceedings of the 16th Annual Meeting of ISMRM, Toronto, Ontario, Canada, 2008. p. 1247.

17. A. Hoyos-ldrobo et al. "On variant strategies to solve the Magnitude Least Squares optimization problem in parallel transmission RF pulse design and under strict SAR and power constraints" IEEE Transactions in Medical Imaging 2014; 33:739-748.

18. Tomi-Tricot R, Gras V, Mauconduit F, et al. B1 artifact reduction in abdominal DCE-MRI using kT-points: First clinical assessment of dynamic RF shimming at 3T. J Magn Reson Imaging.:n/a-n/a. doi:10.1002/jmri.25908

19. Müllner D. The fastcluster package: User's manual. 2017.

20. Pedregosa F, Varoquaux G, Gramfort A, et al. Scikit-learn: Machine learning in Python. J Mach Learn Res. 2011; 12(Oct):2825-2830.

21. Geurts P, Ernst D, Wehenkel L. Extremely randomized trees. Mach Learn. 2006; 63(1):3-42. doi:10.1007/s10994-006-6226-1

22. Cortes C, Vapnik V. Support-vector networks. Mach Learn. 1995; 20(3):273-297. doi:10.1007/BF00994018

23. Wu T-F, Lin C-J, Weng RC. Probability estimates for multi-class classification by pairwise coupling. J Mach Learn Res. 2004; 5(Aug):975-1005.

24. Jones E, Oliphant T, Peterson P, others. SciPy: Open Source Scientific Tools for Python.; 2001. http://www.scipy.org/.

25. Le Y, Kroeker R, Kipfer HD, Lin C. Development and evaluation of TWIST Dixon for dynamic contrast-enhanced (DCE) MRI with improved acquisition efficiency and fat suppression. J Magn Reson Imaging. 2012; 36(2):483-491. doi:10.1002/jmri.23663.

The invention claimed is:

1. A computer-implemented method of building a database of pulse sequences for magnetic resonance imaging, each pulse sequence comprising at least a magnetic field gradient waveform and a set of radio-frequency pulses, each pulse of said set being defined by a plurality of design parameters and being associated to a respective transmission channel (RFC1-RFC8) of a magnetic resonance imaging apparatus; the method comprising:
  a) for each of a plurality of magnetic resonance imaging subjects, determining a pulse sequence, called optimal sequence for the subject, optimizing a cost or merit function representative of a difference between a spatial distribution of nuclear magnetization flip angles, obtained by simulating the pulse sequence on the subject, and a target distribution;
  b) for each subject, computing the values of said cost or merit function or of a different cost or merit function representative of a difference between a spatial distribution of nuclear magnetization flip angles and a target distribution, said values being obtained by simulating the optimal sequences for all the subjects;
  c) aggregating the subjects into a plurality of clusters using a clustering algorithm taking said values, or functions thereof, as metrics; and
  d) for each cluster, determining a pulse sequence, called optimal sequence for the cluster, optimizing a cost or merit function representative of an averaged difference between the spatial distribution of nuclear magnetization flip angles of the subjects belonging to the cluster and the target distribution.

2. The method of claim 1, wherein step a) comprises:
  a1) acquiring inhomogeneity maps of radio-frequency fields generated within the subject by each transmission channel of the magnetic resonance imaging apparatus;
  a2) computing, by taking the said inhomogeneity map or maps as inputs, a spatial distribution of the nuclear magnetization flip angles obtained by simulating said radio-frequency sequence, and
  a3) determining the optimal pulse sequence for the subject by adjusting the design parameters of said radio-frequency pulses and of said gradient waveform to optimize said cost or merit function.

3. The method of claim 1, further comprising:
  e) training a classifier algorithm associating magnetic resonance imaging subjects to the clusters based at least on subject morphological features.

4. The method of claim 3, further comprising:
  f) using the classifier for associating a magnetic resonance imaging subject, not used for carrying out the preceding steps, to a cluster; and
  g) performing magnetic resonance imaging of the subject using the optimal sequence for the cluster.

5. The method of claim 3, further comprising a step of deriving the morphological features from at least a localizer image of the subject.

6. The method of claim 3, wherein the classifier algorithm further uses, for associating a magnetic resonance imaging subject to the clusters, at least one feature chosen among:
  identity data of the subject;
  clinical data of the subject; and
  operating parameters of the magnetic resonance imaging apparatus.

7. The method of claim 3, wherein the classifier algorithm does not use, for associating a magnetic resonance imaging subject to the clusters, features derived by inhomogeneity maps of radio-frequency fields generated within the subject by each transmission channel of the transmission magnetic resonance imaging apparatus.

8. The method of claim 3, wherein steps a) to d) are carried out using a first set of a plurality of subjects and step e) is carried out using, in addition to the first set, a second set of a plurality of subjects for which the cost or merit function representative of an averaged difference between the spatial distribution of nuclear magnetization flip angles of the subjects and the target distribution is also computed.

9. The method of claim 3, further comprising a step α) of training a regression model to predict an average value of a nuclear magnetization flip angle as a function of said features, for the optimal pulse sequence of each cluster determined in step d).

10. The method of claim 1, wherein said clustering algorithm is a hierarchical agglomerative clustering algorithm.

11. The method of claim 10, wherein said hierarchical agglomerative clustering algorithm uses a complete linkage scheme.

12. The method of claim 1, wherein the magnetic resonance imaging apparatus is a parallel magnetic resonance imaging apparatus having a plurality of transmission channels.

13. A method of performing magnetic resonance imaging of a subject, comprising:
  providing a database of pulse sequences, each pulse sequence comprising at least a magnetic field gradient waveform and a set of radio-frequency pulses, each pulse of said set being defined by a plurality of design parameters and being associated to a respective transmission channel (RFC1-RFC8) of a magnetic resonance imaging apparatus, and each pulse sequence of the database optimizing a cost or merit function representative of an averaged difference between the spatial distribution of nuclear magnetization flip angles of the subjects belonging to the cluster and a target distribution;
  receiving, as input, a set of features characterizing the subject, comprising at least a morphological feature of the subject;
  associating the subject to one pulse sequence of the database based on said set of features using a computer-implemented classifier algorithm; and
  performing magnetic resonance imaging using said pulse sequence.

14. The method of claim 13, further comprising a step of deriving the morphological features from at least a localizer image of the subject.

15. The method of claim 13, wherein the classifier algorithm further uses, for associating the magnetic resonance imaging subject to one pulse sequence of the database, at least one feature chosen among:
  identity data of the subject;
  clinical data of the subject; and
  operating parameters of the magnetic resonance imaging apparatus.

16. The method of claim 13, wherein the magnetic resonance imaging apparatus is a parallel magnetic resonance imaging apparatus having a plurality of transmission channels.

17. The method of claim 13, further comprising a step β) of using a regression model for predicting, as a function of said set of features, an average nuclear magnetization flip angle induced in the subject by the associated pulse sequence, and a step γ) of modifying the associated pulse sequence as a function of the predicted average nuclear magnetization flip angle and of a target value thereof.

18. A magnetic resonance imaging apparatus comprising:
at least one radio-frequency transmission channel (RFC1-RFC8);
a set of gradient coils;
a memory storing a database of pulse sequences, each pulse sequence comprising at least a magnetic field gradient waveform and a set of radio-frequency pulses, each pulse of said set being defined by a plurality of design parameters and being associated to a respective transmission channel of the magnetic resonance imaging apparatus, and each pulse sequence of the database optimizing a cost or merit function representative of an averaged difference between the spatial distribution of nuclear magnetization flip angles of the subjects belonging to the cluster and a target distribution; and
a computer programmed for:
receiving, as input, a set of features characterizing a magnetic-resonance imaging subject, comprising at least a morphological feature of the subject;
associating the subject to one pulse sequence of the database based on said set of features using a classifier algorithm; and
driving the radio-frequency transmission channel or channels and the gradient coils for performing magnetic resonance imaging using said pulse sequence.

19. The apparatus of claim 18, comprising a plurality of radio-frequency transmission channels, wherein the computer is programmed for driving the radio-frequency transmission channels and the gradient coils for performing parallel-transmission magnetic resonance imaging using said pulse sequence.

\* \* \* \* \*